US012707968B2

(12) United States Patent
Lu et al.

(10) Patent No.: US 12,707,968 B2
(45) Date of Patent: Aug. 11, 2026

(54) HEAT REMOVING LAYER SURROUNDING A TRANSISTOR

(71) Applicant: Invention and Collaboration Laboratory, Inc., Taipei City (TW)

(72) Inventors: Chao-Chun Lu, Hsinchu (TW); Wen-Hsien Tu, Hsinchu (TW); Feng-Wu Chen, Hsinchu (TW)

(73) Assignee: INVENTION AND COLLABORATION LABORATORY INC., Taipei City (TW)

( * ) Notice: Subject to any disclaimer, the term of this patent is extended or adjusted under 35 U.S.C. 154(b) by 0 days.

(21) Appl. No.: 19/308,968

(22) Filed: Aug. 25, 2025

(65) Prior Publication Data

US 2025/0391734 A1 Dec. 25, 2025

Related U.S. Application Data

(63) Continuation of application No. 19/189,728, filed on Apr. 25, 2025.

(Continued)

(51) Int. Cl.

*H10W 40/25* (2026.01)
*H10D 30/60* (2025.01)

(Continued)

(52) U.S. Cl.

CPC ........ *H10W 40/253* (2026.01); *H10D 30/601* (2025.01); *H10D 30/62* (2025.01); *H10D 62/115* (2025.01); *H10D 64/021* (2025.01); *H10D 84/0147* (2025.01); *H10D 84/0184* (2025.01); *H10W 40/259* (2026.01);

(Continued)

(58) Field of Classification Search

CPC ............ H01L 23/3738; H01L 23/3731; H10D 30/601; H10D 62/115; H10D 64/021; H10D 84/0147; H10D 84/0184; H10D 30/62; H10D 30/162; H10W 40/259; H10W 40/253

See application file for complete search history.

(56) References Cited

U.S. PATENT DOCUMENTS 12,224,225 B2 * 2/2025 Lu ........................ H10W 40/258
12,381,123 B2 * 8/2025 Lu ........................ H10W 20/20

(Continued)

FOREIGN PATENT DOCUMENTS

KR 10-2022-0054482 A 5/2022

OTHER PUBLICATIONS

Korean Office Action for Korean Application No. 10-2025-0055370, dated Nov. 11, 2025, with English translation.

*Primary Examiner* — Alonzo Chambliss
(74) *Attorney, Agent, or Firm* — Birch, Stewart, Kolasch & Birch, LLP

(57) ABSTRACT

A semiconductor circuit structure includes a semiconductor substrate with an original semiconductor surface, an active region within the semiconductor substrate, and a transistor formed based on the active region. The transistor includes a gate structure, a first spacer neighboring to a first sidewall of the gate structure, and a second spacer neighboring to a second sidewall of the gate structure. Wherein a thermal conductivity of the first spacer or the second spacer includes is higher than the thermal conductivity of silicon nitride ($Si_3N_4$).

11 Claims, 24 Drawing Sheets

Related U.S. Application Data

(60) Provisional application No. 63/665,273, filed on Jun. 28, 2024, provisional application No. 63/638,984, filed on Apr. 26, 2024.

(51) Int. Cl.

| | |
|---|---|
| ***H10D 30/62*** | (2025.01) |
| ***H10D 62/10*** | (2025.01) |
| ***H10D 64/01*** | (2025.01) |
| ***H10D 84/01*** | (2025.01) |
| *H10B 12/00* | (2023.01) |
| *H10D 30/00* | (2025.01) |
| *H10D 30/63* | (2025.01) |
| *H10D 84/85* | (2025.01) |

(52) U.S. Cl.

CPC .............. *H10B 12/05* (2023.02); *H10B 12/30* (2023.02); *H10B 12/50* (2023.02); *H10D 30/503* (2025.01); *H10D 30/6211* (2025.01); *H10D 30/6212* (2025.01); *H10D 30/63* (2025.01); *H10D 84/85* (2025.01)

(56) References Cited

U.S. PATENT DOCUMENTS

| | | | | |
|---|---|---|---|---|
| 2022/0189821 | A1 | 6/2022 | Levy et al. | |
| 2022/0406666 | A1* | 12/2022 | Huang | H10D 84/0193 |
| 2023/0352482 | A1 | 11/2023 | Teng et al. | |

* cited by examiner

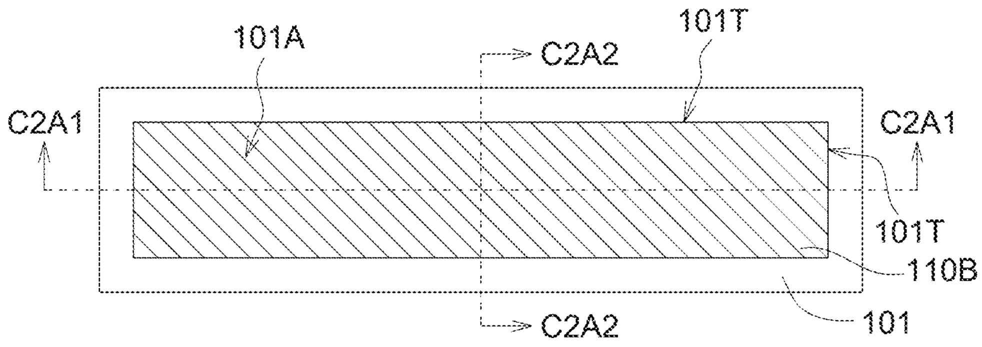
FIG. 2A(1)
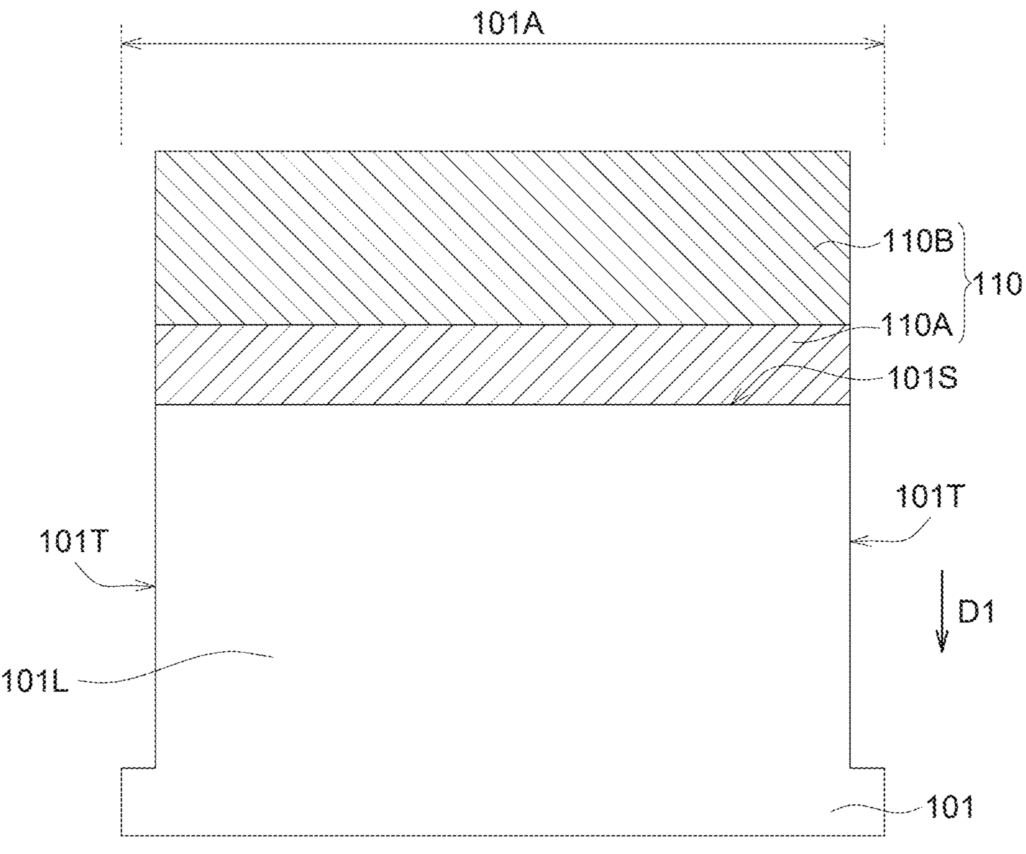
FIG. 2A(2)

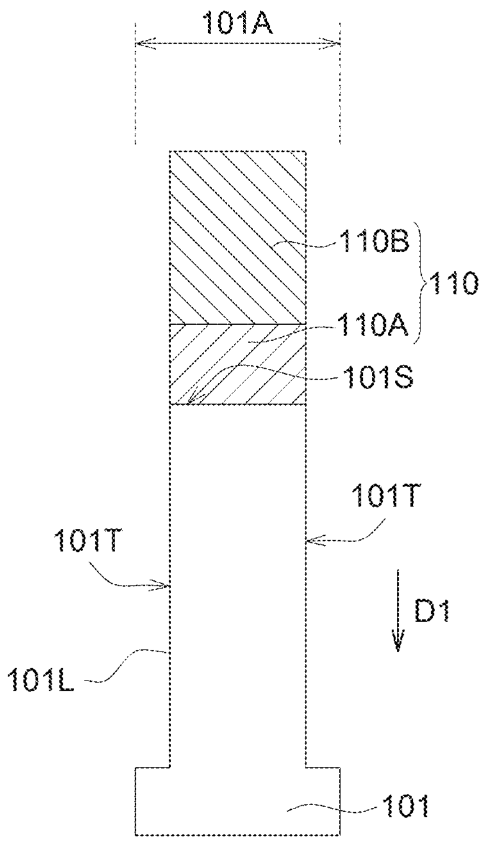
FIG. 2A(3)

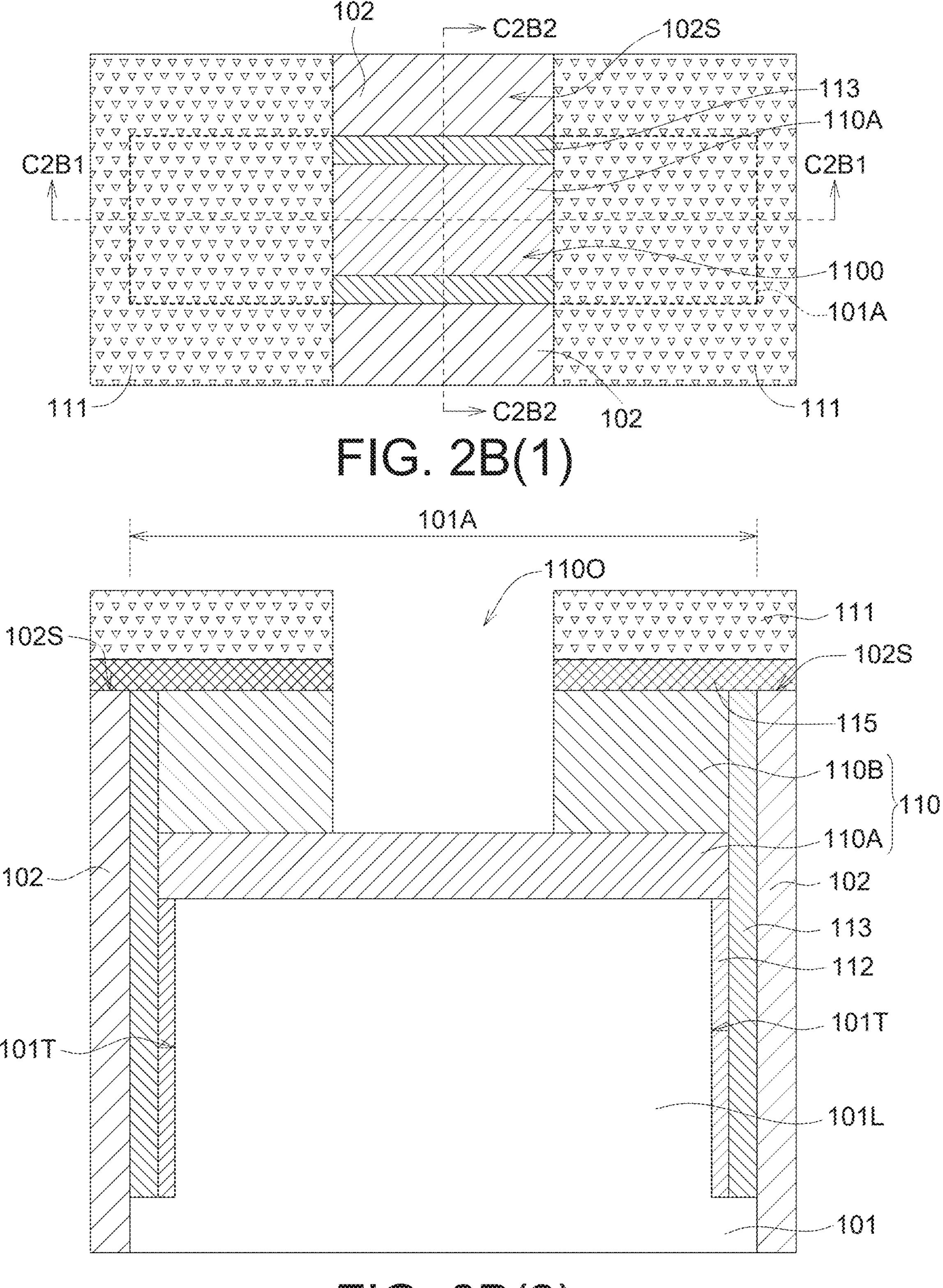
FIG. 2B(1)
FIG. 2B(2)

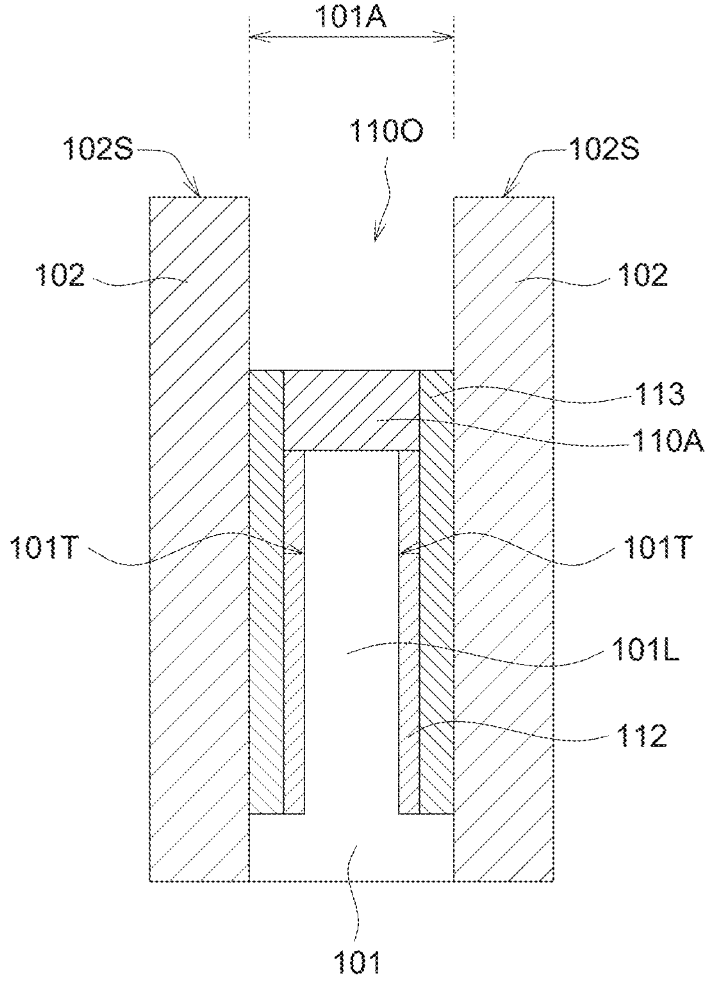
FIG. 2B(3)

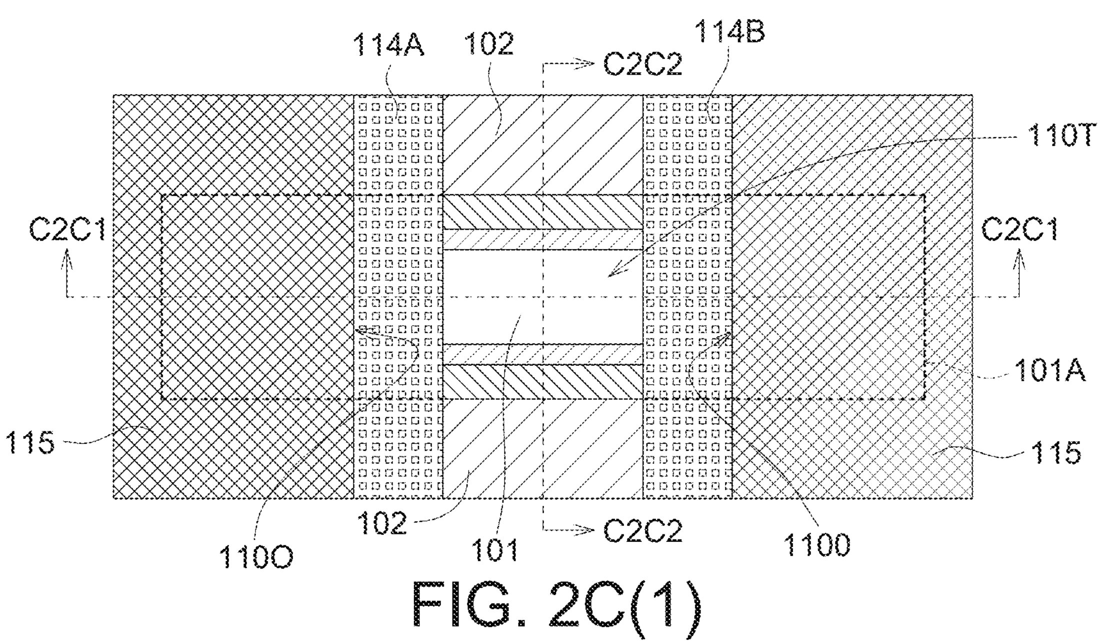
FIG. 2C(1)
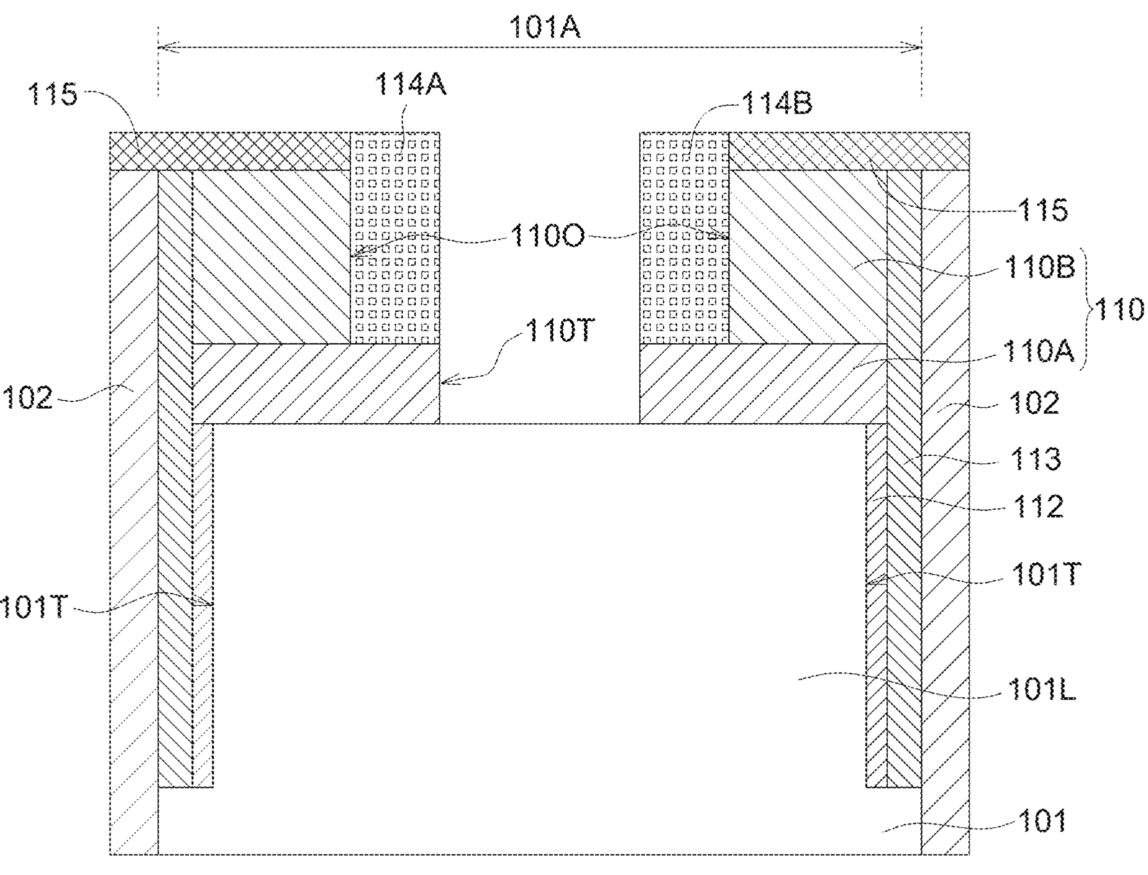
FIG. 2C(2)

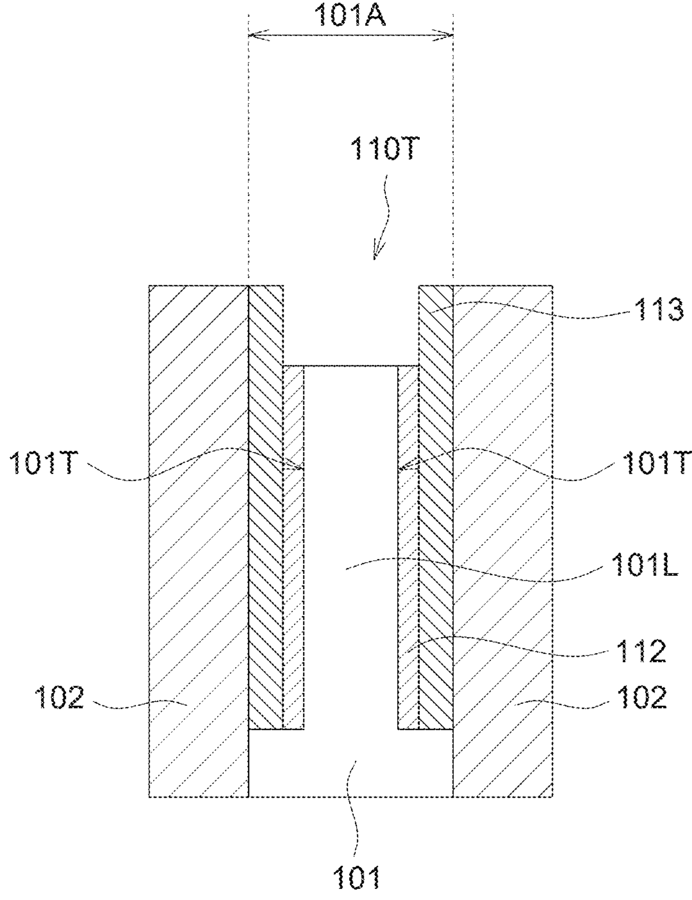
FIG. 2C(3)

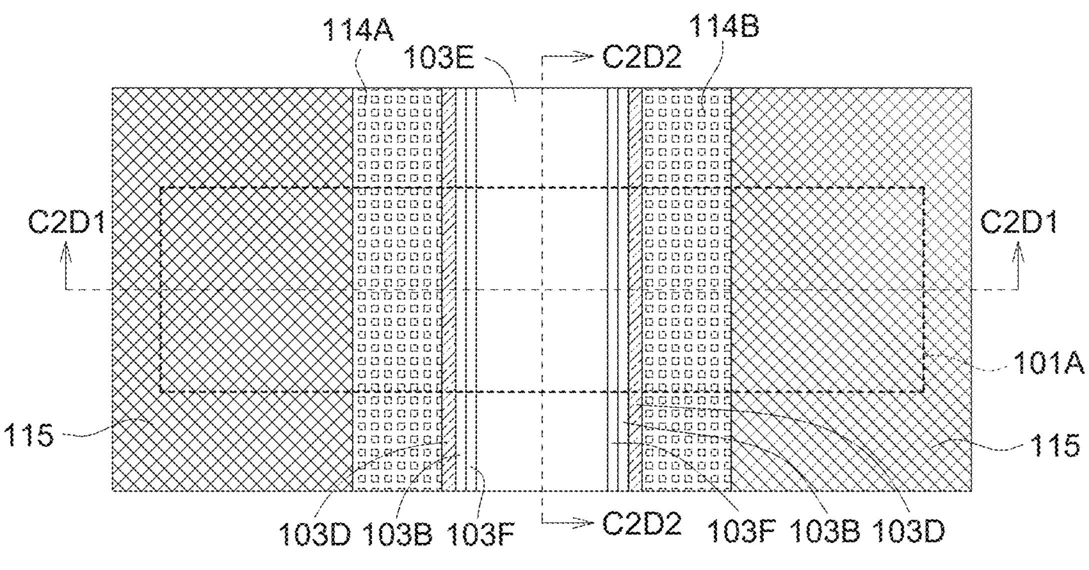
FIG. 2D(1)
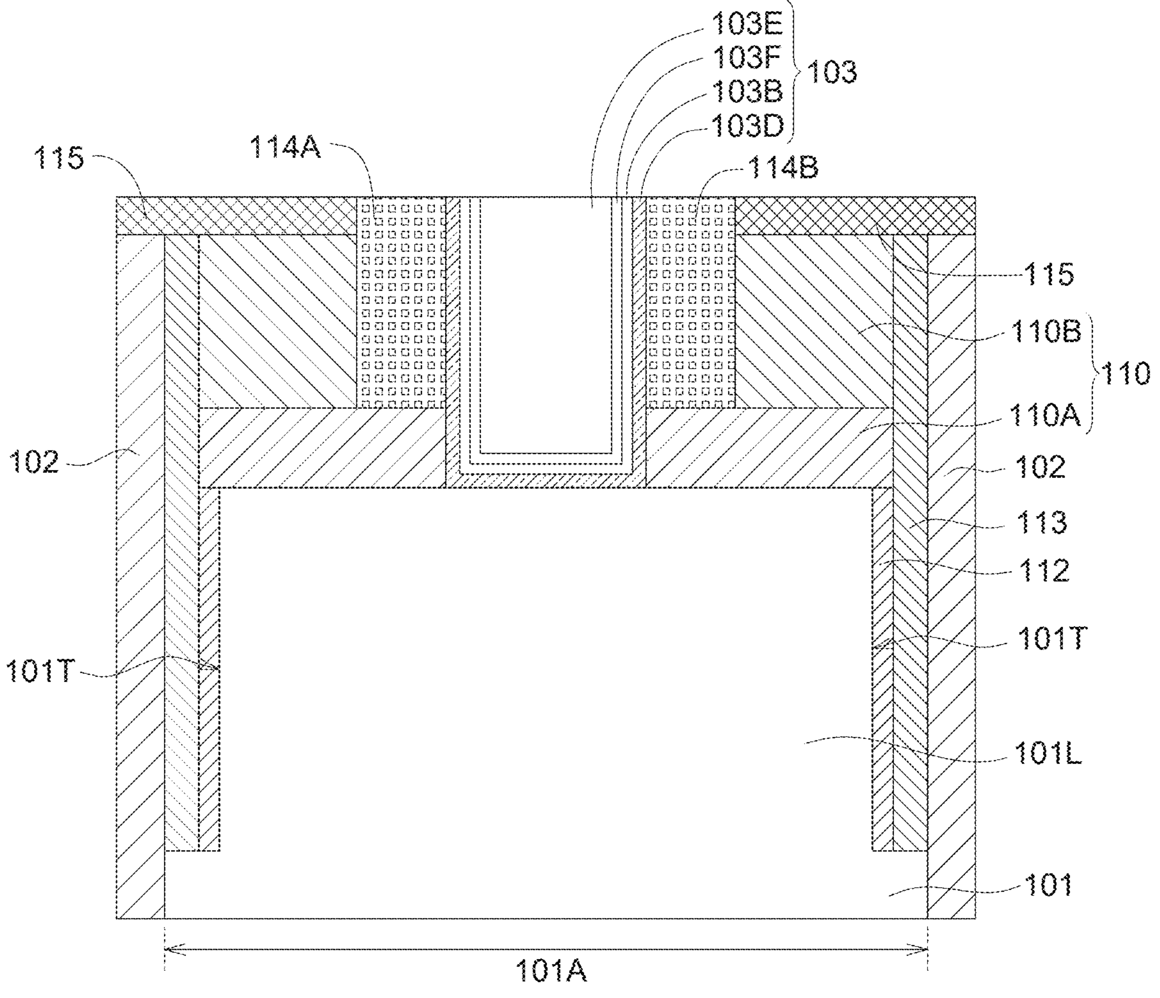
FIG. 2D(2)

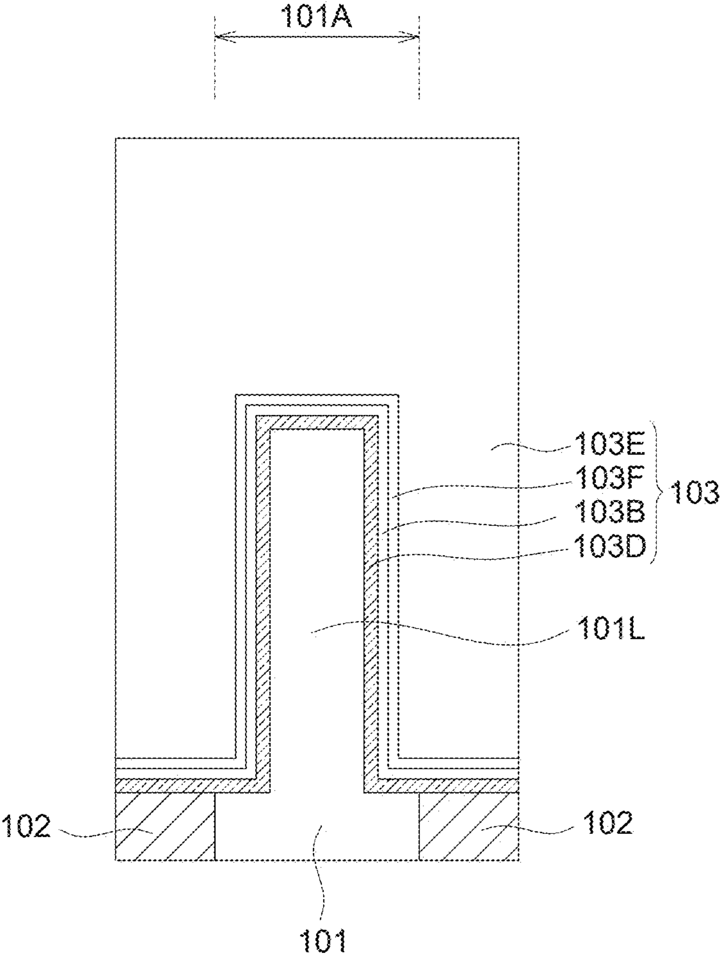
FIG. 2D(3)

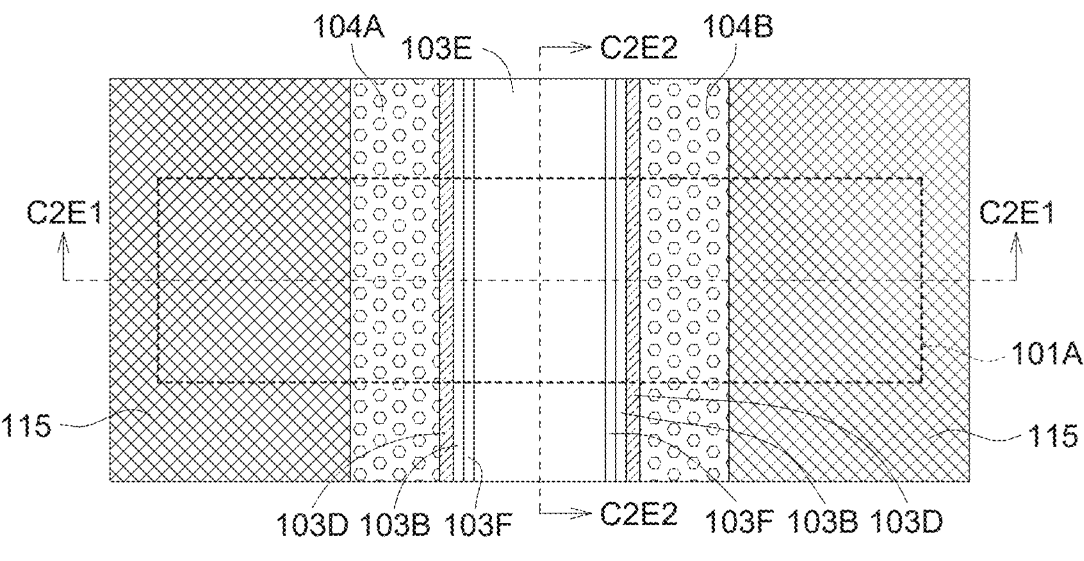
FIG. 2E(1)
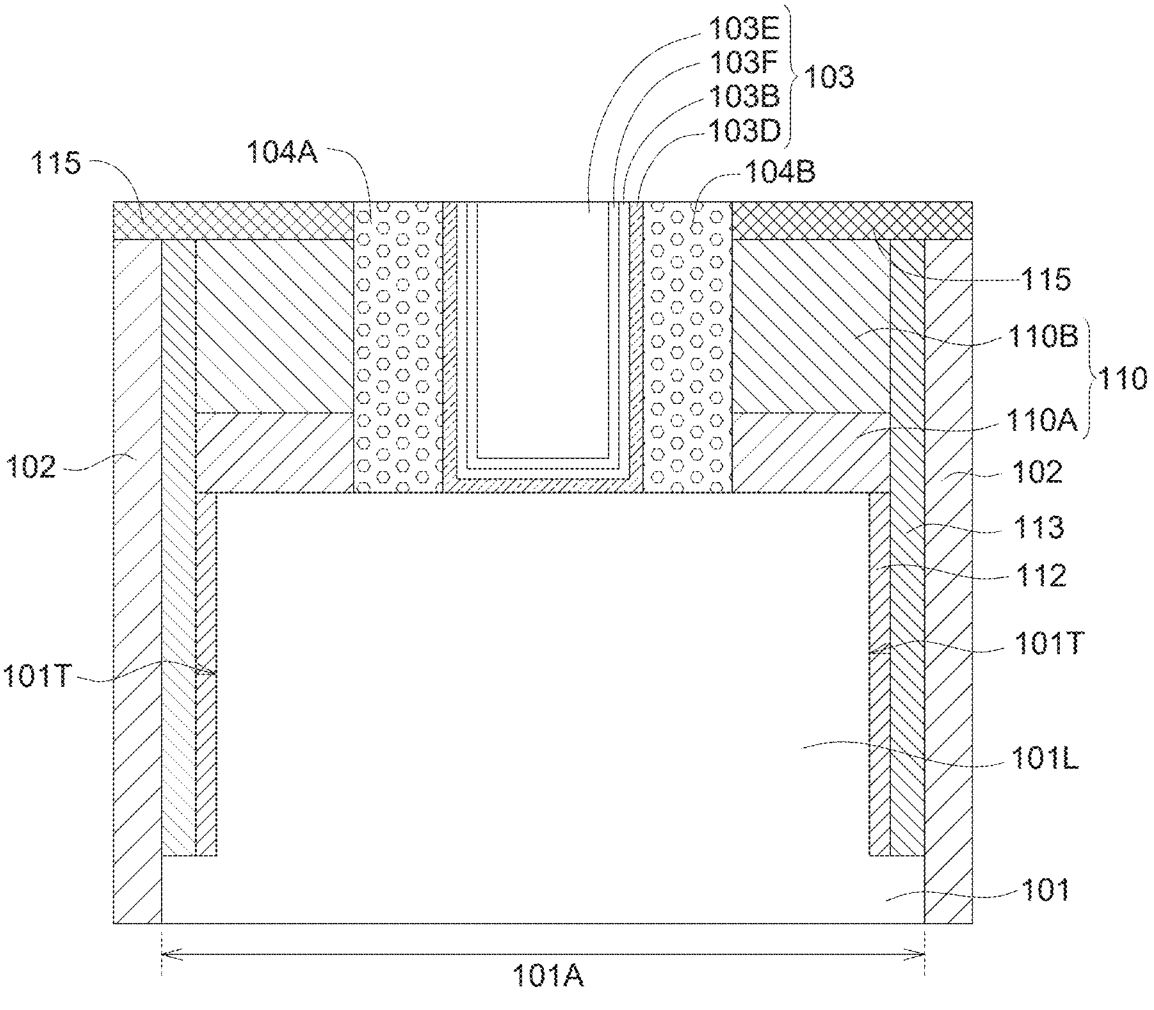
FIG. 2E(2)

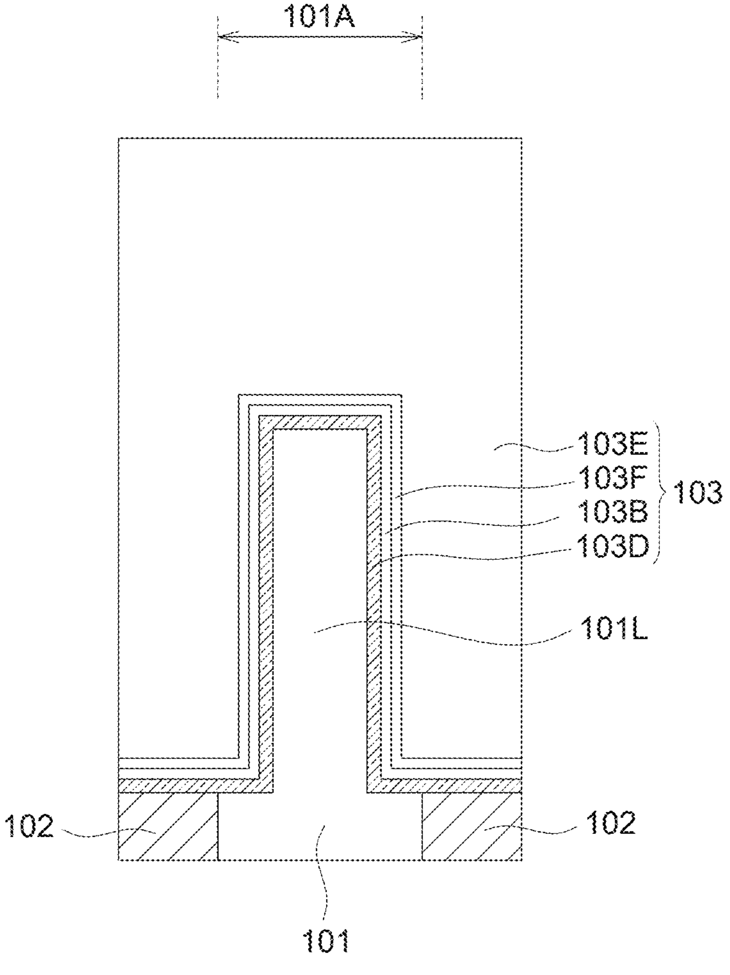
FIG. 2E(3)

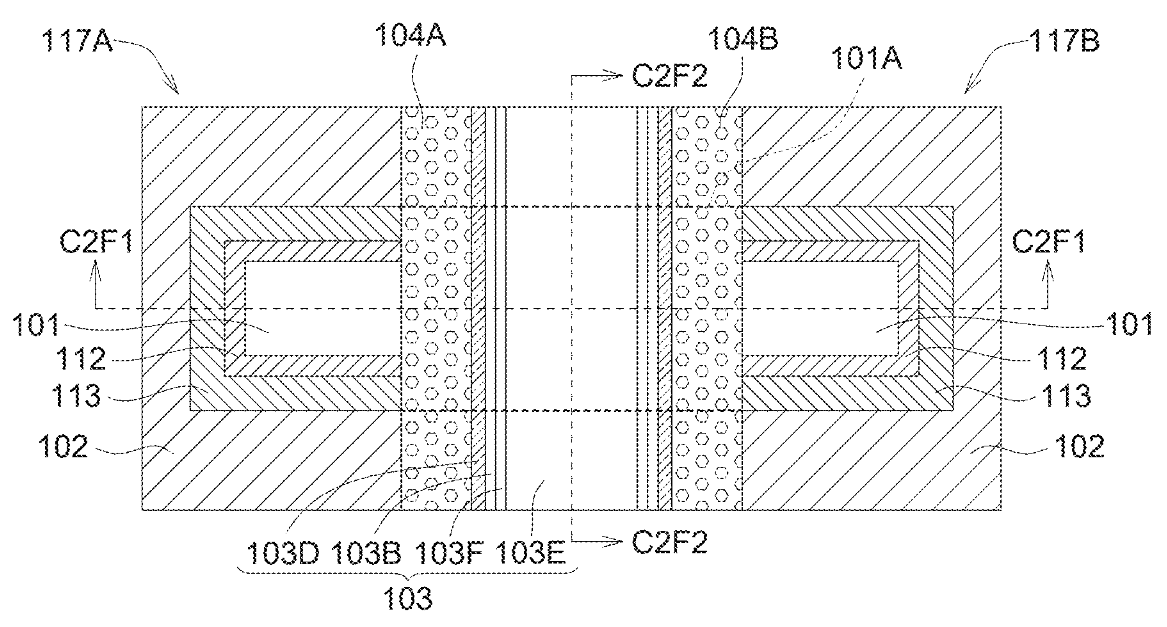
FIG. 2F(1)
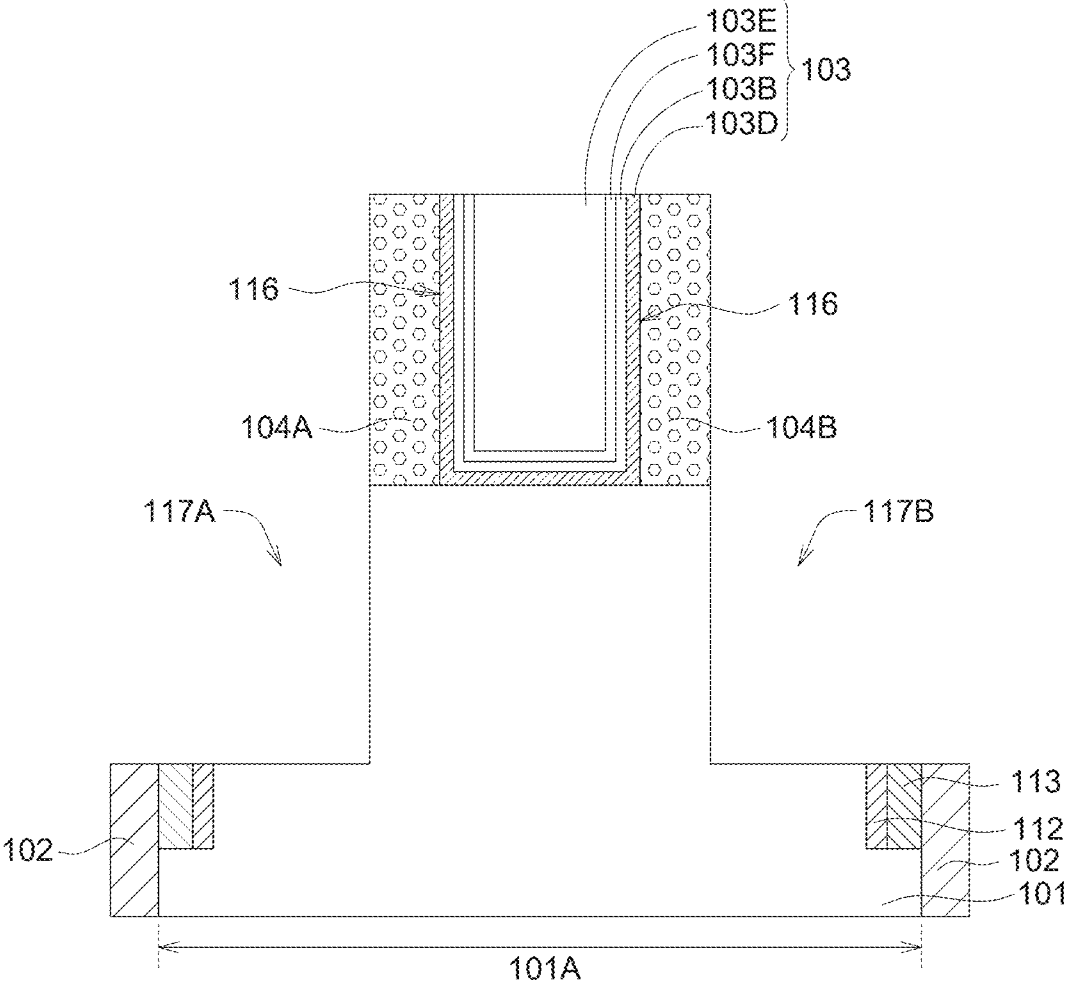
FIG. 2F(2)

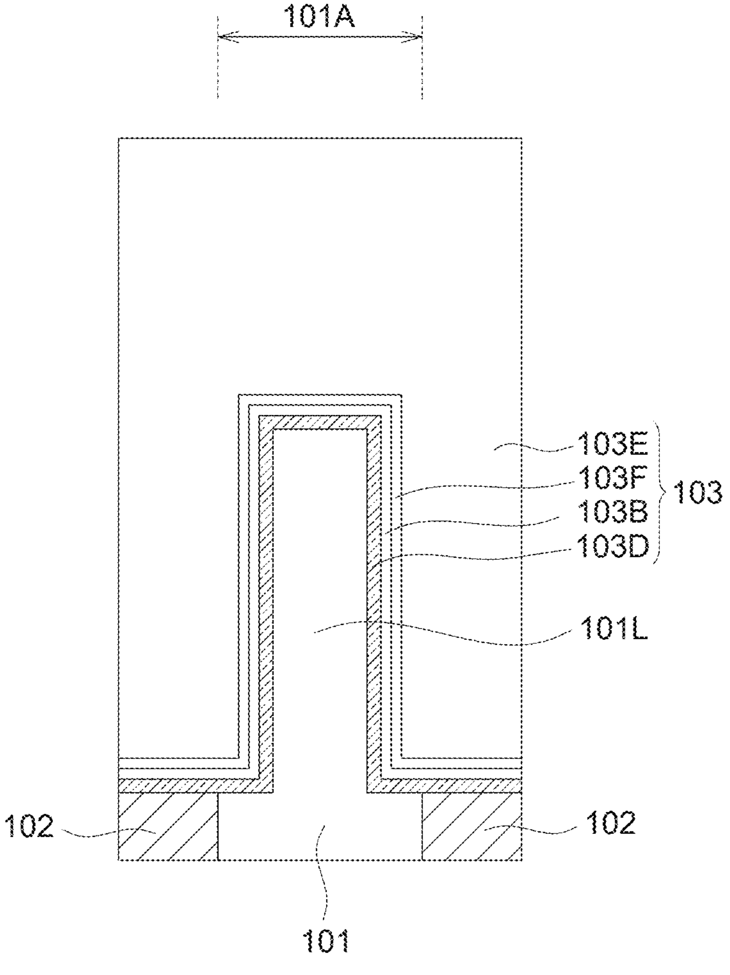
FIG. 2F(3)

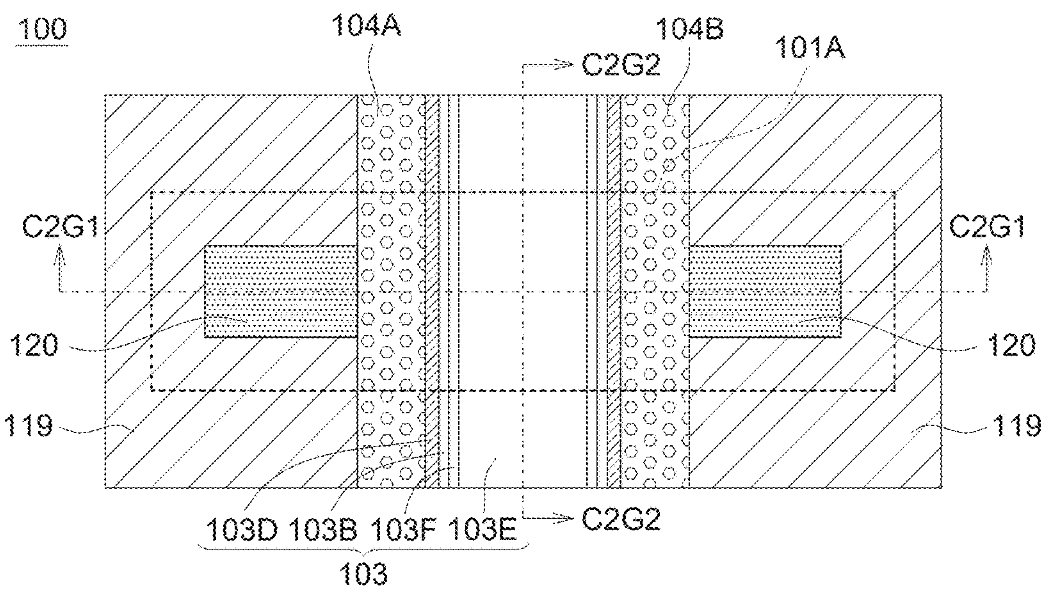
FIG. 2G(1)
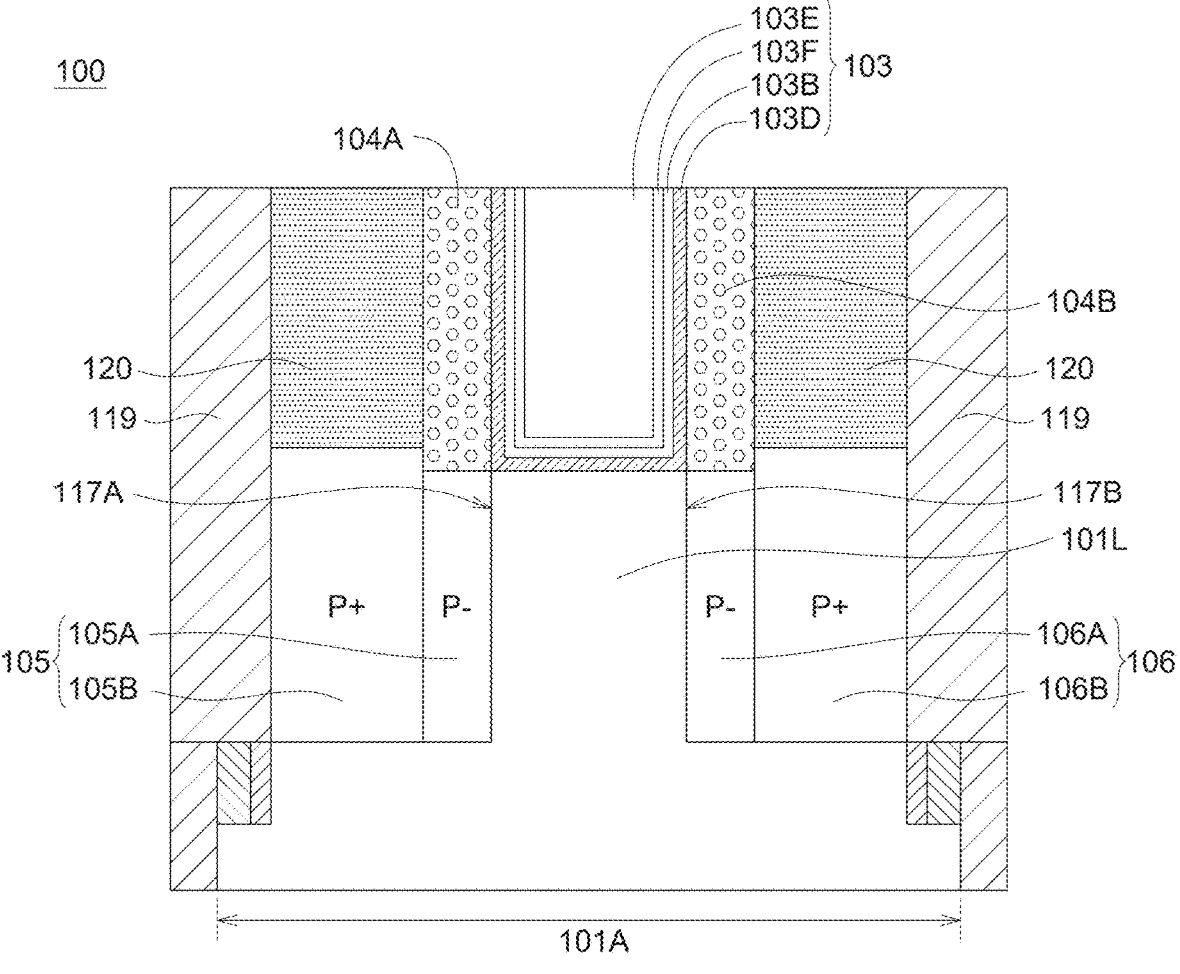
FIG. 2G(2)

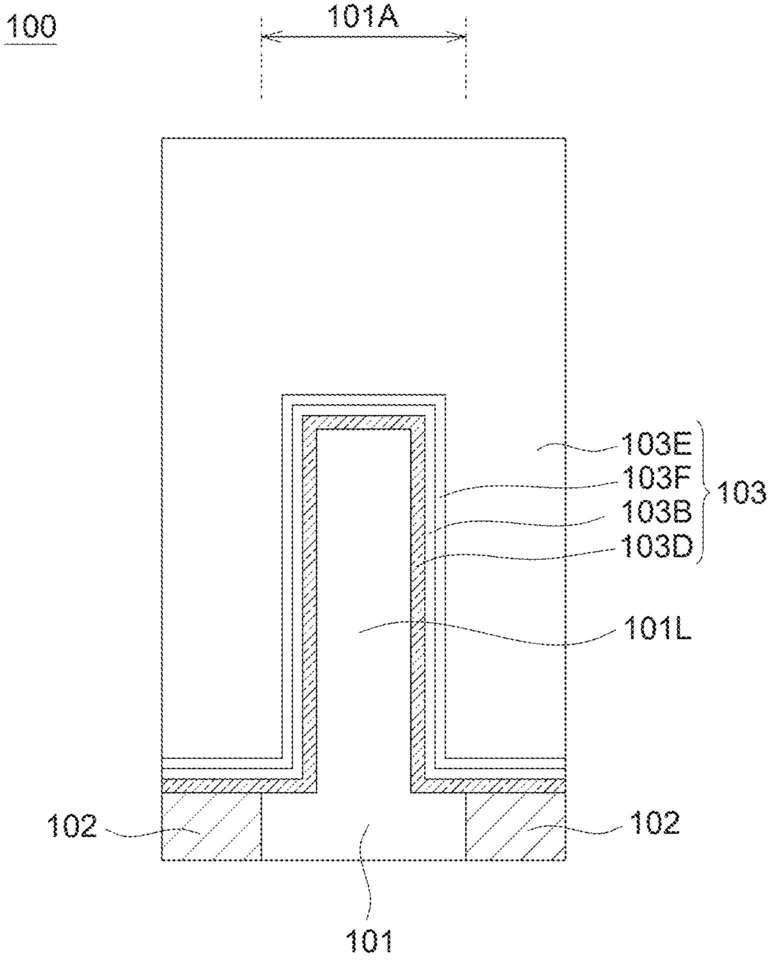
FIG. 2G(3)

HEAT REMOVING LAYER SURROUNDING A TRANSISTOR

This application is a continuation of U.S. patent application Ser. No. 19/189,728 field on Apr. 25, 2025, which claims the benefit of U.S. provisional application Ser. No. 63/638,984 filed Apr. 26, 2024, Ser. No. 63/665,273 filed Jun. 28, 2024 and the subject matter of which is incorporated herein by reference.

BACKGROUND OF THE DISCLOSURE

Field of the Disclosure

The present invention relates to a semiconductor device and method for manufacturing the same, and particularly to a transistor structure and method for manufacturing the same.

Description of the Related Art

In the state-of-the-art integrated circuits there are many transistors which are connected by conductive interconnections (e.g., Metal wires, polysilicon wires, etc.) to facilitate the signal transfer among the Gate, the Source and the Drain regions (GSD) of these transistors. All these metal wires depend on many contact holes and connection plugs to connect them with GSD, respectively, which causes significant challenges and difficulties with respect to chip-design targets of reducing area, power and noise and increasing performances of integrated circuits especially when the dimensions of integrate circuits on dice must be shrunk significantly owing to demands on scaling device dimensions in order to satisfy Moore's Law. To give an example about concerning on the area penalty: A much larger source or drain diffusion area in contrast to the contact-hole size for connecting metal wires to either Source or Drain must be designed so that the unavoidable photolithographic misalignment due to limitations of lithographic tools should not cause the contact holes to be made outside the underneath edges of Source or Drain region, respectively. This inevitably increases diffusion areas of transistors and thus die areas, which induces large capacitances to cause significant penalties to the ac performance of circuits, to consume higher power and to add larger noises. How to introduce a better self-aligned contact structure and technology to use the least surface areas for connecting the silicon transistor to its first interconnect (Metal) layer to transmit and receive signals is a key challenge for further effective scaling down and improving performance of integrated circuits.

Moreover, the monolithic integration capability of a Silicon chip has grown from GSI (Giga Scale Integration: Over billions of transistors on a die) toward TSI (Tera Scale Integration: Trillions of transistors on a die) soon and chip performance is being improved significantly. Accordingly, the power consumption of running such a huge number of transistors is increasing sharply, which elevates adversely the junction temperature of transistors and thus the entire chip temperature due to current limited heat-dissipation capability (e.g. Thermal conductivity index of Silicon-dioxide is very low. This material and device structural problem causes a negative cyclic effect, that is, the elevated higher die temperature slows down the speed of transistors, and then inevitably enforcing the design to increase higher power to circuitry in order to accelerate the transistor performance but this mechanism causes badly raising the die temperature, and consequently the heat-dissipation problem is getting worse. Actually this insufficient heat dissipation problem causing higher temperature to chip operation is regarded as the worst problem for the entire chip industry to solve to avoid a major roadblock to a larger number of device integration on a die. The progress of reducing the temperature of a GSI chip is not improved well as it should be, however. Actually as the transistor dimensions must be made smaller as the technology node is being scaled further (e.g. the minimum feature size is being scaled from 7 nm to 5 nm, then to 3 nm and so forth), the percentage of oxide coverage to the total transistor size is getting higher and the thermal dissipation capability across the device junctions is further being aggregated. Though a lot of heat dissipation methods are created, for example, covering the entire chip with higher heat-removal pad outside the chip or using a liquid cooling circulation outside the packaged chip, etc., all of which are very expensive but returned with low efficiency for effectively reducing the junction temperatures of transistors.

SUMMARY OF THE DISCLOSURE

One object of the present disclosure is to provide a semiconductor circuit structure, wherein the semiconductor circuit structure includes a semiconductor substrate with an original semiconductor surface, an active region within the semiconductor substrate, and a transistor formed based on the active region. The transistor includes a gate structure, and a first spacer neighboring to a first sidewall of the gate structure, and a second spacer neighboring to a second sidewall of the gate structure. Wherein a thermal conductivity of the first spacer or the second spacer is higher than the thermal conductivity of silicon nitride ($Si_3N_4$).

According to one embodiment of the present disclosure, the wherein the first spacer is made of silicon carbide (SiC), hexagonal boron nitride (h-BN), aluminum nitride (AlN) or an arbitrary combination thereof or an arbitrary combination thereof.

According to one embodiment of the present disclosure, the transistor further includes a second spacer neighboring to a second sidewall of the gate structure, a channel region covered by the gate structure, a source structure coupled to a first terminal of the channel region, and a drain structure coupled to a second terminal of the channel region. Wherein the first spacer is between the gate structure and the source structure, and the second spacer is between the gate structure and the drain structure.

According to one embodiment of the present disclosure, the source structure includes a first lightly doped drain (LDD) region and a first heavily doped region, and the first spacer covers the first LDD region or the first heavily doped region of the source structure.

According to one embodiment of the present disclosure, the drain structure includes a second LDD region and a second heavily doped region, and the second spacer covers the second LDD region or the second heavily doped region of the drain structure.

According to one embodiment of the present disclosure, the transistor is a fin field-effect transistor (FinFET), a gate-all-around (GAA) transistor, or a complementary field-effect transistor (CFET).

According to one embodiment of the present disclosure, the semiconductor circuit structure further includes a first isolation region next to the action region, wherein the first isolation region includes a first heat removing layer, and the material of the first heat removing layer is different from silicon dioxide ($SiO_2$).

According to one embodiment of the present disclosure, the first isolation region is a shallow trench isolation (STI) region surrounds the transistor, and the first isolation region further includes a $SiO_2$ layer under the first heat removing layer.

According to one embodiment of the present disclosure, the first isolation region further includes a second heat removing layer above the first heat removing layer, and the material of the second heat removing layer is different from that of the first heat removing layer.

According to one embodiment of the present disclosure, the heat removing layer is positioned under the original semiconductor surface.

According to one embodiment of the present disclosure, the first spacer, the second spacer and the first heat removing layer are within a front end of line (FEOL) region of the semiconductor circuit structure.

a top surface of the isolation region is higher than the original semiconductor surface of the semiconductor substrate.

Another object of the present disclosure is to provide a semiconductor circuit structure, wherein the semiconductor circuit structure includes a semiconductor substrate with an original semiconductor surface, an active region within the semiconductor substrate, and a transistor within the active region. The transistor includes a gate structure, a channel region covered by the gate structure, a source region electrically connected to one end of the channel region, a drain region electrically connected to another end of the channel region, a first heat removing spacer next to the gate structure and covering the source region, and a second heat removing spacer next to the gate structure and covering the drain region.

According to one embodiment of the present disclosure, a thermal conductivity of the first heat removing spacer or the second heat removing spacer is higher than 2.0 W/m·K.

According to one embodiment of the present disclosure, the semiconductor circuit structure further includes a shallow trench isolation (STI) region surrounds the transistor, wherein the STI region comprises a heat removing layer, and a thermal conductivity of the heat removing layer is higher than that of silicon dioxide ($SiO_2$).

According to one embodiment of the present disclosure, a top surface of the heat removing layer is close to the source region or the drain region.

According to one embodiment of the present disclosure, the first heat removing spacer or the second heat removing spacer is made of a material selected from a group consisting of SiC, h-BN, AlN and the arbitrary combinations thereof.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings:

FIG. 2A(1) is a top view illustrating the structure after the at least one trench is formed to define a fin island serving as an active area in the semiconductor substrate; FIGS. 2A(2) and 2A(3) are cross-sectional views respectively taken along the cutting-lines C2A1 and C2A2 as depicted in FIG. 2A(1);

FIG. 2B(1) is a top view illustrating the structure after the opening is formed in the patterned pad layer over the at least one active area; FIGS. 2B(2) and 2B(3) are cross-sectional views respectively taken along the cutting-lines C2B1 and C2B2 as depicted in FIG. 2B(1);

FIG. 2C(1) is a top view illustrating the structure after the gate trench is formed in the patterned pad layer; FIGS. 2C(2) and 2C(3) are i cross-sectional views respectively taken along the cutting-lines C2C1 and C2C2 as depicted in FIG. 2C(1);

FIG. 2D(1) is a top view illustrating the structure after the gate structure is formed; FIGS. 2D(2) and 2D(3) are cross-sectional views taken along the cutting-lines C2D1 and C2D2 as depicted in FIG. 2D(1);

FIG. 2E(1) is a top view illustrating the structure after the at least one spacer is formed; FIGS. 2E(2) and 2E(3) are cross-sectional views respectively taken along the cutting-lines C2E1 and C2E2 as depicted in FIG. 2E(1);

FIG. 2F(1) is a top view illustrating the structure after the source recess and the drain recess are formed; FIG. 2F(2) and FIG. 2F(3) are cross-sectional views respectively taken along the cutting-lines C2F1 and C2F2 as depicted in FIG. 2F(1);

FIG. 2G(1) is a top view illustrating the structure after the source structure and the drain structure are formed; FIGS. 2G(2) and 2G(3) are cross-sectional views respectively taken alone the cutting-lines C2G1 and C2G2 as depicted in FIG. 2G(1);

DETAILED DESCRIPTION OF THE DISCLOSURE

The present disclosure provides a semiconductor circuit structure 100 for effectively reducing the junction temperatures of transistors included in the semiconductor circuit structure 100. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

The present embodiment discloses a semiconductor circuit structure 100 with innovation structure to improve its thermal dissipation capability. In the embodiments of the present disclosure, semiconductor circuit structure 100 includes a plurality of transistors disposed different areas, and the innovation structure as described below can be applied for effectively reducing the junction temperatures thereof.

Figure 1:
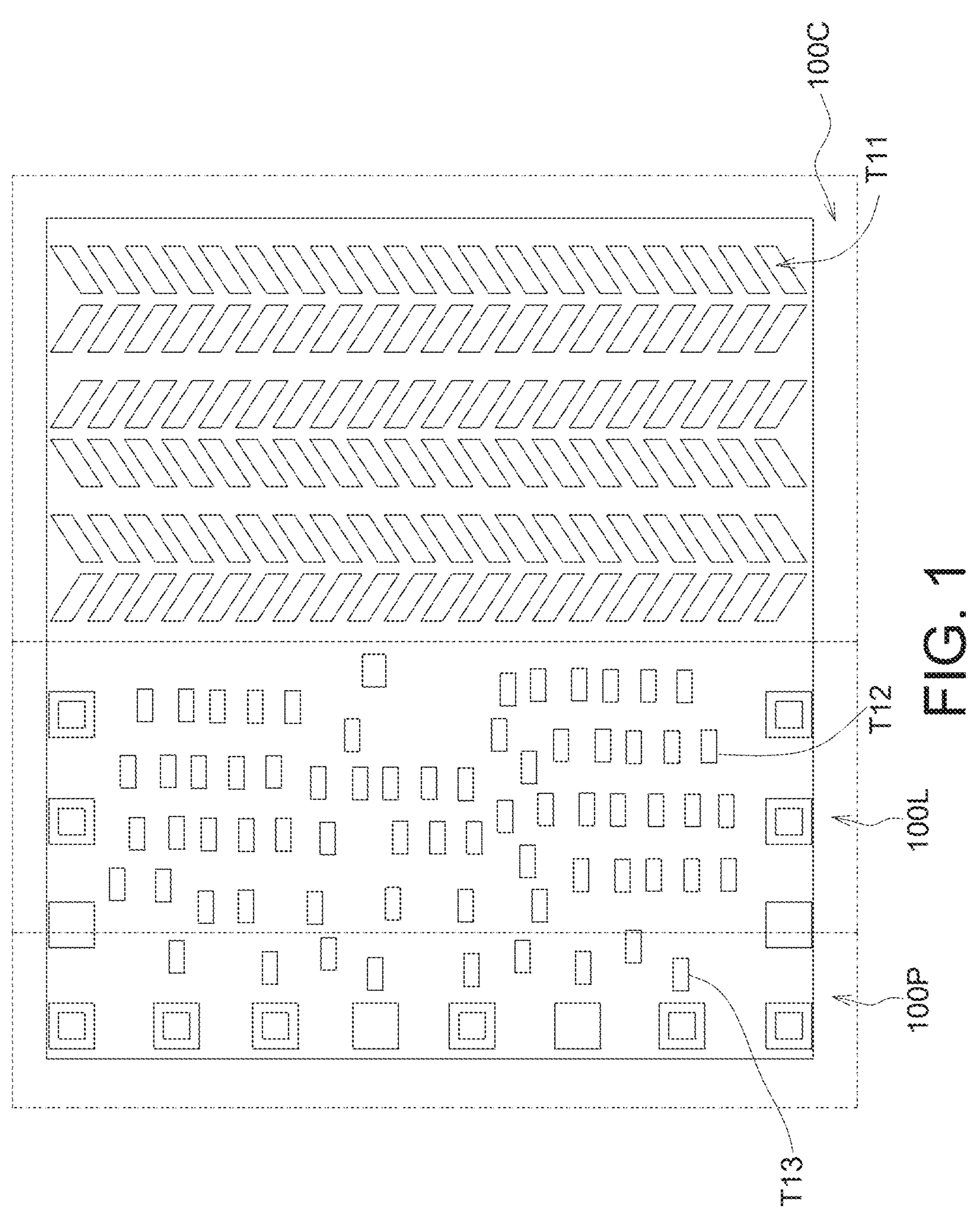
FIG. 1 is a top view illustrating the structure of a DRAM circuit (the semiconductor circuit structure) according to one embodiment of the present disclosure.

For example, the semiconductor circuit structure 100 may be a dynamic random access memory (DRAM) circuit. FIG. 1 is a top view illustrating the structure of the DRAM circuit (the semiconductor circuit structure 100) according to one embodiment of the present disclosure. The DRAM circuit includes a plurality memory cells 100C and a peripheral circuit which may include a logic area 100L having a logic circuit and a peripheral area 100P having a peripheral I/O circuit. Wherein, each of the memory cell 100C, the logic circuit and the peripheral I/O circuit includes at least one transistor T11, T12 and T13 within active regions or active areas, respectively. In some embodiments, each of the transistors T11, T12 and T13 can be a FinFET, a GAA transistor, a recess gate (RG) transistor, or a complementary field-effect transistor (CFET); and the innovation structure as described below can be applied both to the transistors T11, T12 and T13 for effectively reducing the junction temperatures thereof.

Embodiment 1

Detailed steps of the manufacturing method of the semiconductor circuit structure 100 as follows:

- Step S11: A semiconductor substrate 101 with an original surface 101S is provided;
- Step S12: At least one active area 101A is defined in the semiconductor substrate 101; wherein the Step S12 for defining the active area 101A includes Sub-steps S121-S122:
  - Sub-step S121: An etching process using a patterned pad layer 110 (including a pad oxide layer 110A and a pad nitride layer 110B stacked in sequence) as an etching mask is performed to form at least one trench 101T extending into the semiconductor substrate 101 from an original surface 101S of the semiconductor substrate 101 along a direction D1 and defined a fin island
  - Sub-step S122: A shallow trench isolation (STI) region filled with a STI structure 102 is formed in the at least one trench 101T to surround the fin island 101L;
- Step S13: A gate structure 103 is formed within the at least one active area 101A, and the Step S13 for forming the gate structure 103 includes Sub-steps S131-S134:
  - Sub-step S131: An opening 1100 is formed in the patterned pad layer 110 over the at least one active area 101A;
  - Sub-step S132: At least one dummy spacer (such as, a first dummy spacer 114A and a second dummy spacer 114B) is formed on the sidewall of the opening 1100;
  - Sub-step S133: A gate trench 110T connecting with the opening 1100 is formed in the patterned pad layer 110 to exposing a portion of the at least one active area 101A; and
  - Sub-step S134: A gate dielectric layer 103D, a barrier layer 103B, a work function layer 103F are formed in sequence to cover the bottom and sidewalls of the gate trench 110T; and a gate electrode 103E is formed to full-fill the gate trench 110T;
- Step S14: At least one spacer (such as, a first spacer 104A and a second spacer 104B) is formed neighboring to at least on sidewall of the gate structure 103, wherein the least one spacer (the first spacer 104A or the second spacer 104B) has a thermal conductivity higher than the thermal conductivity of silicon nitride ($Si_3N_4$), SiOCN or $SiO_2$; and the Step S14 for forming the at least one spacer includes Sub-steps S141-S142:
  - Sub-step S141: The at least one dummy spacer (e.g., the first dummy spacer 114A and the second dummy spacer 114B) is removed; and
  - Sub-step S142: A material having a thermal conductivity higher than the thermal conductivity of silicon nitride ($Si_3N_4$), SiOCN or $SiO_2$ is formed to take the place of the removed dummy spacer (e.g., the first dummy spacer 114A and the second dummy spacer 114B);
- Step S15: A source structure 105 and a drain structure 106 are formed in the at least one active area 101A and neighboring to the gate structure 103; wherein the Step S15 for forming the source structure 105 and the drain structure 106 includes Sub-steps S151-S15:
  - Sub-step S151: A source recess 117A and a drain recess 117B extending into the semiconductor substrate 101 from the original surface 101S of the semiconductor substrate 101 are formed in the active area 101A;
  - Sub-step S152: A first lightly doped drain (LDD) region 105A and a second LDD region 106A are formed from the portions of the semiconductor substrate 101 exposed by the source recess 117A and the drain recess 117B; and
  - Sub-step S153: A first heavily doped region 105B and a second heavily doped region 106B respectively based on the first LDD region 105A and the second LDD region 106A are formed in the source recess 117A and the drain recess 117B.

Referring to Step S11: A semiconductor substrate 101 having an original surface 101S is provided. In some embodiments of the present disclosure, the semiconductor substrate 101 may be a silicon-containing substrate, such as a silicon (Si) wafer or a silicon-on-insulator (SOI) substrate. In some other embodiments of the present disclosure, the semiconductor substrate 101 may be made of other types of semiconductor materials, such as germanium (Ge), or compound semiconductor materials, such as gallium arsenide (GaAs), SiC, or GaN, etc. In the present embodiment, the semiconductor substrate 101 may be a silicon wafer.

Referring to Step S12: At least one active area 101A is defined in the semiconductor substrate 101; wherein the Step S12 for defining the active area 101A includes Sub-steps S121-S122:

Referring to Sub-step S121: A pad layer 110 including a pad oxide layer 110A and a pad nitride layer 110B is formed on the original surface 101S of the semiconductor substrate 101. The pad layer 110 is then patterned to remove a portion of the pad layer 110. Next, an etching process using the remained portion of the pad layer 110 as an etching mask is performed to form at least one trench 101T extending into the semiconductor substrate 101 from an original surface 101S of the semiconductor substrate 101 along a direction D1 and defined the at least one active area 101A. In one embodiment, the one active area 101A includes a fin island 101L for a FinFET transistor.

FIG. 2A(1) is a top view illustrating the structure after the at least one trench 101T is formed to define a fin island 101L serving as an active area 101A in the semiconductor substrate 101; FIG. 2A(2) is a cross-sectional view take along the cutting-line C2A1 as depicted in FIG. 2A(1); FIG. 2A(3) is a cross-sectional view take along the cutting-line C2A2 as depicted in FIG. 2A(1).

Referring to Sub-step S122: A STI region filled with the STI structure 102 is formed in the at least one trench 101T to surround the fin island 101L. The forming of the STI region filled with the STI structure 102 includes performing a deposition process to deposit dielectric material filling the at least one trench 101T; and then performing an etch back process or a planarization process to remove the portion of the dielectric material over the patterned pad layer 110 (i.e., the patterned pad nitride layer 110B), so as to make the STI structure 102 having a top surface 102S higher than the original surface 101S of the semiconductor substrate 101, and the top surface 102S of the STI structure 102 could be leveled up to the top of the patterned pad layer 110. In some embodiment of the present disclosure, the dielectric material used for forming the STI structure 102 may be silicon oxide (such as, $SiO_2$), $Si_3N_4$, or the combinations thereof or other suitable dielectric material.

In some embodiments of the present disclosure, prior to forming the STI structure 102, a silicon oxide thin layer 112 is formed on the bottom and the sidewalls of the at least one trench 101T (covering on the sidewalls of the fin island 101L) by a thermal oxidation; and a silicon nitride film 113 is then formed to cover the silicon oxide thin layer 112 (as shown in FIG. 2B(2)).

Referring to Step S13: A gate structure 103 is formed on the at least one active area 101A. The forming of the gate structure 103 includes Sub-steps S131-S134:

Referring to Sub-step S131: An opening 1100 is formed in the patterned pad layer 110 over the at least one active area 101A. In some embodiment of the present disclosure, the opening 1100 is formed by an etching process using a patterned photoresist layer 111 and a patterned amorphous silicon-carbon (a-SiC) layer 115 as an etching mask to remove a portion of the patterned pad nitride layer 110B disposed on the active area 101A and expose a portion of the patterned pad oxide layer 110A (as shown in FIG. 2B(2)).

FIG. 2B(1) is a top view illustrating the structure after the opening 1100 is formed in the patterned pad layer 110 over the at least one active area 101A; FIG. 2B(2) is a cross-sectional view take along the cutting-line C2B1 as depicted in FIG. 2B(1); FIG. 2B(3) is a cross-sectional view take along the cutting-line C2B2 as depicted in FIG. 2B(1).

Referring to Sub-step S132: At least one dummy spacer (such as, a first dummy spacer 114A and a second dummy spacer 114B) is formed on the sidewall of the opening 1100. In some embodiments of the present disclosure, the forming of the at least one dummy spacer (e.g., the first dummy spacer 114A and the second dummy spacer 114B) includes steps as follows: The STI structure 102 not covered by the a-SiC layer 115 is etched down (such as etched to the top of the patterned pad oxide layer 110A). Then, a deposition process is performed to formed silicon nitride cover the sidewalls of the opening 1100, and an etching back process is then performed to remove the portion of the deposited silicon nitride covering the patterned a-C layer 115 and the bottom of the opening 1100 to expose a portion of the pad oxide layer 110A.

Referring to Sub-step S133: A gate trench 110T connecting with the opening 1100 is formed in the patterned pad layer 110 to expose a portion of the at least one active area 101A. In the present embodiment, the gate trench 110T is formed by an etching process, using the patterned a-SiC layer 115 and the dummy spacer (e.g., the first dummy spacer 114A and the second dummy spacer 114B) as an etching mask, and removing a portion of the patterned pad oxide layer 110A, so as to expose a portion of the at least one active area 101A.

FIG. 2C(1) is a top view illustrating the structure after the gate trench 110T is formed in the patterned pad layer 110; FIG. 2C(2) is a cross-sectional view take along the cutting-line C2C1 as depicted in FIG. 2C(1); FIG. 2C(3) is a cross-sectional view take along the cutting-line C2C2 as depicted in FIG. 2C(1).

Referring to Sub-step S134: A gate dielectric layer 103D, a barrier layer 103B, a work function layer 103F are formed in sequence to cover the bottom and sidewalls of the gate trench 110T; and a gate electrode 103E is formed to full-fill the gate trench 110T. Before forming the gate dielectric layer 103D, the STI structure 102 not covered by the a-SiC layer 115 is further etched down (such as etched below the bottom of the fin island 101L). Then, the silicon oxide thin layer 112 and the silicon nitride film 113 are removed to reveal the fin island 101L. Thereafter, a plurality of deposition/etching back processes are performed to respectively form the gate dielectric layer 103D, the barrier layer 103B, the work function layer 103F and the gate electrode 103E, and the combination thereof form the gate structure 103. In the present embodiment the gate electrode 103E includes metal, and the work function layer 103F includes a multi-layer structure.

FIG. 2D(1) is a top view illustrating the structure after the gate structure 103 is formed; FIG. 2D(2) is a cross-sectional view take along the cutting-line C2D1 as depicted in FIG. 2D(1); FIG. 2D(3) is a cross-sectional view take along the cutting-line C2D2 as depicted in FIG. 2D(1).

Referring to Step S14: At least one spacer (e.g., a first spacer 104A and a second spacer 104B) is formed neighboring to at least on sidewall of the gate structure 103, wherein the least one spacer (the first spacer 104A or the second spacer 104B) has a thermal conductivity higher than the thermal conductivity of $Si_3N_4$, SiOCN or $SiO_2$; and the Step S14 for forming the at least one spacer includes Sub-steps S141-S142:

Referring to Sub-step S141: The at least one dummy spacer (e.g., the first dummy spacer 114A and the second dummy spacer 114B) is removed. In some embodiments of the present disclosure, an etching process using the patterned a-SiC layer 115 and the gate structure 103 (including the gate dielectric layer 103D, the barrier layer 103B, the work function layer 103F and the gate electrode 103E) as an etching mask to remove the at least one dummy spacer (e.g., the first dummy spacer 114A and the second dummy spacer 114B), meanwhile the portion of the pad oxide layer 110A beneath the at least one dummy spacer (e.g., the first dummy spacer 114A and the second dummy spacer 114B) can be also removed. Then, the STI structure 102 originally below the dummy spacer 114A and 114B is etched down to the bottom of the fin island 101L, such that at least one spacer recess 116 next to the aforesaid gate structure is formed to expose a portion of the fin island 101L within the active area 101A.

Referring to Sub-step S142: A material having a thermal conductivity higher than the thermal conductivity of $Si_3N_4$, SiOCN or $SiO_2$ is formed to take the place of the removed dummy spacer (e.g., the first dummy spacer 114A and the second dummy spacer 114B). For example, silicon carbide (SiC with thermal conductivity of 20 W/m·K), hexagonal boron nitride (h-BN) with thermal conductivity of 444 W/m·K), aluminum nitride (AlN), or other dielectric material having a thermal conductivity higher than the thermal conductivity of $Si_3N_4$ and/or SiOCN could be deposited to full-fill the at least one spacer recess 116, so as to form the least one spacer (such as, a first spacer 104A and a second spacer 104B).

FIG. 2E(1) is a top view illustrating the structure after the at least one spacer (e.g., the first spacer 104A and the second spacer 104B, or called "heat removing spacer") is formed; FIG. 2E(2) is a cross-sectional view take along the cutting-line C2E1 as depicted in FIG. 2E(1); FIG. 2E(3) is a cross-sectional view take along the cutting-line C2E2 as depicted in FIG. 2E(1).

Referring to Step S15: A source structure 105 and a drain structure 106 are formed in the at least one active area 101A and neighboring to the gate structure 103; wherein the Step S15 for forming the source structure 105 and the drain structure 106 includes Sub-steps S151-S15:

Referring to Sub-step S151: A source recess 117A and a drain recess 117B extending into the semiconductor substrate 101 from the original surface 101S of the semiconductor substrate 101 are formed in the active area 101A. In some embodiments of the present disclosure, the forming of the source recess 117A and the drain recess 117B includes steps as follows: The patterned a-SiC layer 115 is removed to reveal the patterned pad layer 110, then an etching process using the gate structure 103 and the heat removing spacer (such as, a first spacer 104A and a second spacer 104B) as an etching mask to remove the revealed pad layer 110 and a portion of the semiconductor substrate 101 (the fin island 101L) of the active area 101A, so as to form a source recess 117A and a drain recess 117B extending into the semiconductor substrate 101 from the original surface 101S of the semiconductor substrate 101 along the direction D1, and to expose sidewalls and/or bottom of the fin island 101L.

In some embodiments of the present disclosure, the etching process for forming the source recess 117A and the drain recess 117B may further remove portions of the STI structure 102 not covered by the gate structure 103 and the heat removing spacer, the silicon oxide thin layer 112 and the silicon nitride film 113. In other embodiment, the STI structure 102 not covered by the gate structure 103 and the heat removing spacer is not etched down such that the top of the STI structure 102 is higher than the top of the original surface 101S of the silicon substrate 101.

FIG. 2F(1) is a top view illustrating the structure after the source recess 117A and the drain recess 117B are formed; FIG. 2F(2) is a cross-sectional view take along the cutting-line C2F1 as depicted in FIG. 2F(1); FIG. 2F(3) is a cross-sectional view take along the cutting-line C2F2 as depicted in FIG. 2F(1).

Referring to Sub-step S152: A first lightly doped drain (LDD) region 105A and a second LDD region 106A are formed in the portions of the semiconductor substrate 101 exposed from the source recess 117A and the drain recess 117B. In some embodiments of the present disclosure, at least one ion implantation process or selectively epitaxial growth (SEG) process is performed to form the first LDD region 105A and the second LDD region 106A. In one embodiment, the first LDD region 105A and the second LDD region 106A are formed under the heat removing spacer (e.g., respectively beneath the first spacer 104A and a second spacer 104B), and the edge of the LDD region (the edge of the first LDD region 105A or the edge of the second LDD region 106A) could be aligned with the sidewall of the gate structure 103.

Referring to Sub-step S153: A first heavily doped region 105B and a second heavily doped region 106B respectively based on the first LDD region 105A and the second LDD region 106A are formed in the source recess 117A and the drain recess 117B. In some embodiments of the present disclosure, a selective epitaxy growth (SEG) method or an atomic layer deposition (ALD) method is applied to form the first heavily doped region 105B and the second heavily doped region 106B respectively based on the first LDD region 105A and the second LDD region 106A exposed from the source recess 117A and the drain recess 117B. The combination of the first LDD region 105A and the first heavily doped region 105B form the source structure 105; and the combination of the second LDD region 106A and the second heavily doped region 106B form the drain structure 106. The gate structure 102, the source structure 105 and the drain structure 106 together form the transistor T11 (T12 or T13).

FIG. 2G(1) is a top view illustrating the structure after the source structure 105 and the drain structure 106 are formed; FIG. 2G(2) is a cross-sectional view taken alone the cutting-line C2G1 as depicted in FIG. 2G(1); FIG. 2G(3) is a cross-sectional view taken alone the cutting-line C2G2 as depicted in FIG. 2G(1).

Figure 2H:
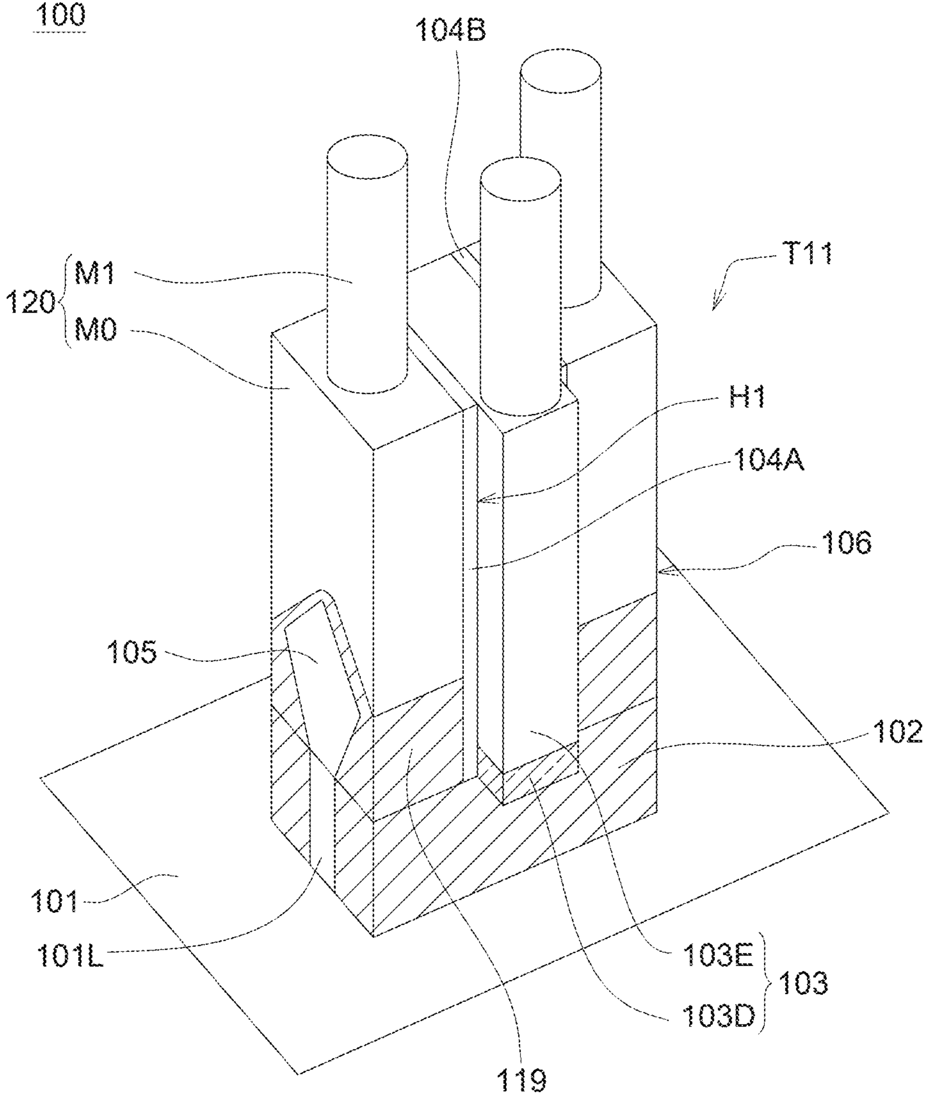
FIG. 2H is a partial perspective view illustrating the a semiconductor circuit structure including a FinFET according to one embodiment of the present disclosure.

After a series steps of down-stream process are performed to form, such as a ILDs 119 full-filling the source recess 117A and the drain recess 117B and metal interconnections 120 (including metal layers M0 and/or M1) connecting to the transistor T11 (T12 or T13), thereby the forming of the semiconductor circuit structure 100 as shown FIG. 2H can be implemented. In the present embodiment, the transistor T11 of the semiconductor circuit structure 100 can be a FinFET. Since the heat removing spacer (e.g., the first spacer 104A and the second spacer 104B) is configured very close to the hot spot H1 (as shown in FIG. 2H) in the interface between the channel region 118 and the first LDD region 105A (or the interface between the channel region 118 and the second LDD region 106A), and has a thermal conductivity higher than that of $Si_3N_4$ or SiOCN applied by the conventional gate spacers, thus the heat removing spacer (e.g., the first spacer 104A and the second spacer 104B) can serves as an effective knob for cooling the transistor T11 (T12 or T13). In the present embodiment, the heat removing spacer made of SiC with a thermal conductivity of 20 W/m·K can cool down the transistor T11 (T12 or T13) around 24° C.~30° C., in comparison with a conventional transistor using a $Si_3N_4$ spacer (having a thermal conductivity of 2 W/m·K).

Figure 2I:
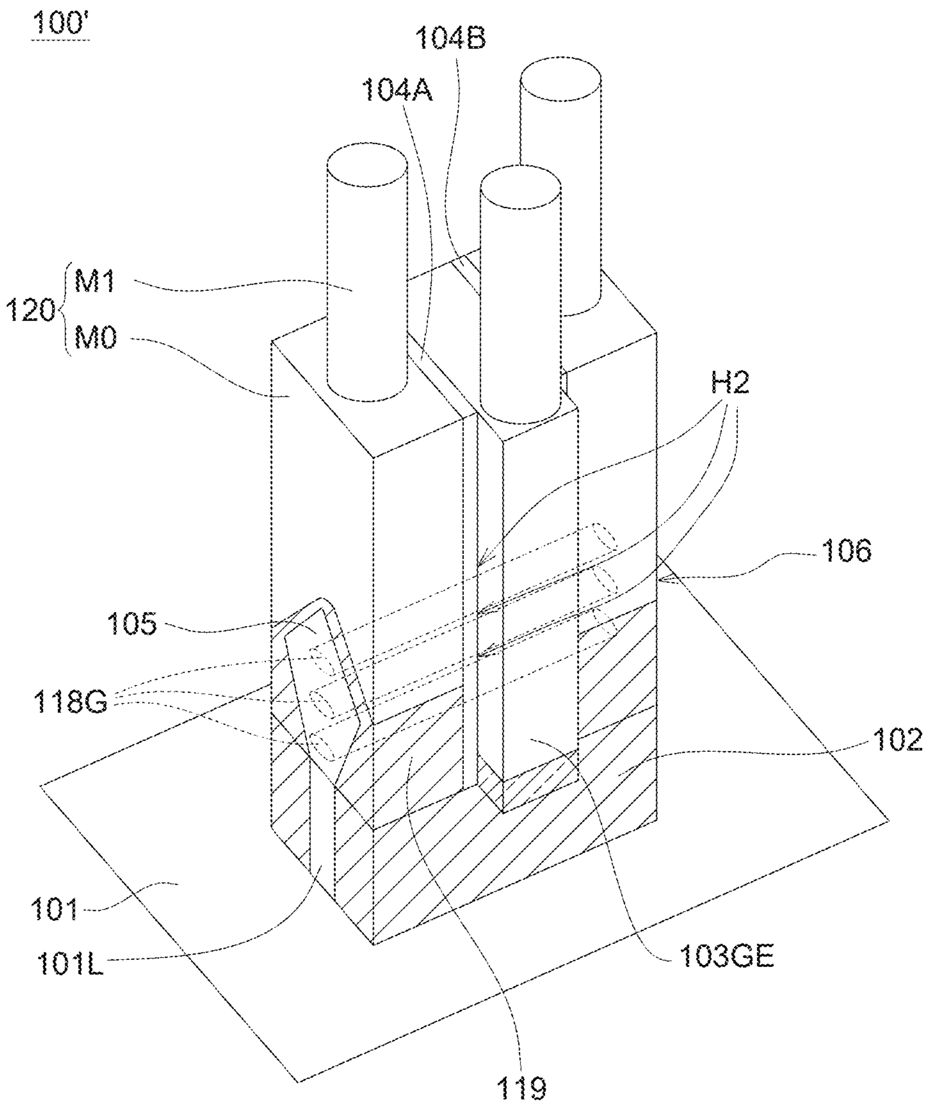
FIG. 2I is a partial perspective view illustrating a semiconductor circuit structure including a GAA transistor according to another embodiment of the present disclosure.

Of course, the heat removing spacer with high thermal conductivity will reduce junction temperature of other types of transistor (such as a recess gate (RG) transistor, a CFET or a GAA transistor) and improve its performance. For example, FIG. 2I is a partial perspective view illustrating a semiconductor circuit structure 100' including a GAA transistor T2 according to another embodiment of the present disclosure. The structure of the semiconductor circuit structure 100' as depicted in FIG. 2I is similar to that of the semiconductor circuit structure 100 as depicted in FIG. 2H except that the GAA transistor T2 has a plurality of channel regions 118G totally surrounded by the gate structure (including gate dielectric layer, the barrier layer, the work function layer (not shown) and the gate electrode 103GE).

In the present embodiment, the first spacer 104A and the second spacer 104B are also very close to the hot spot H2 in the interface between the narrow sheet/channel region 118G and the source structure 105 (or the interface between the sheet/channel region 118G and the drain structure 106), thus the first spacer 104A and the second spacer 104B can serves as an effective knob for cooling the GAA transistor T2.

Figure 2J:
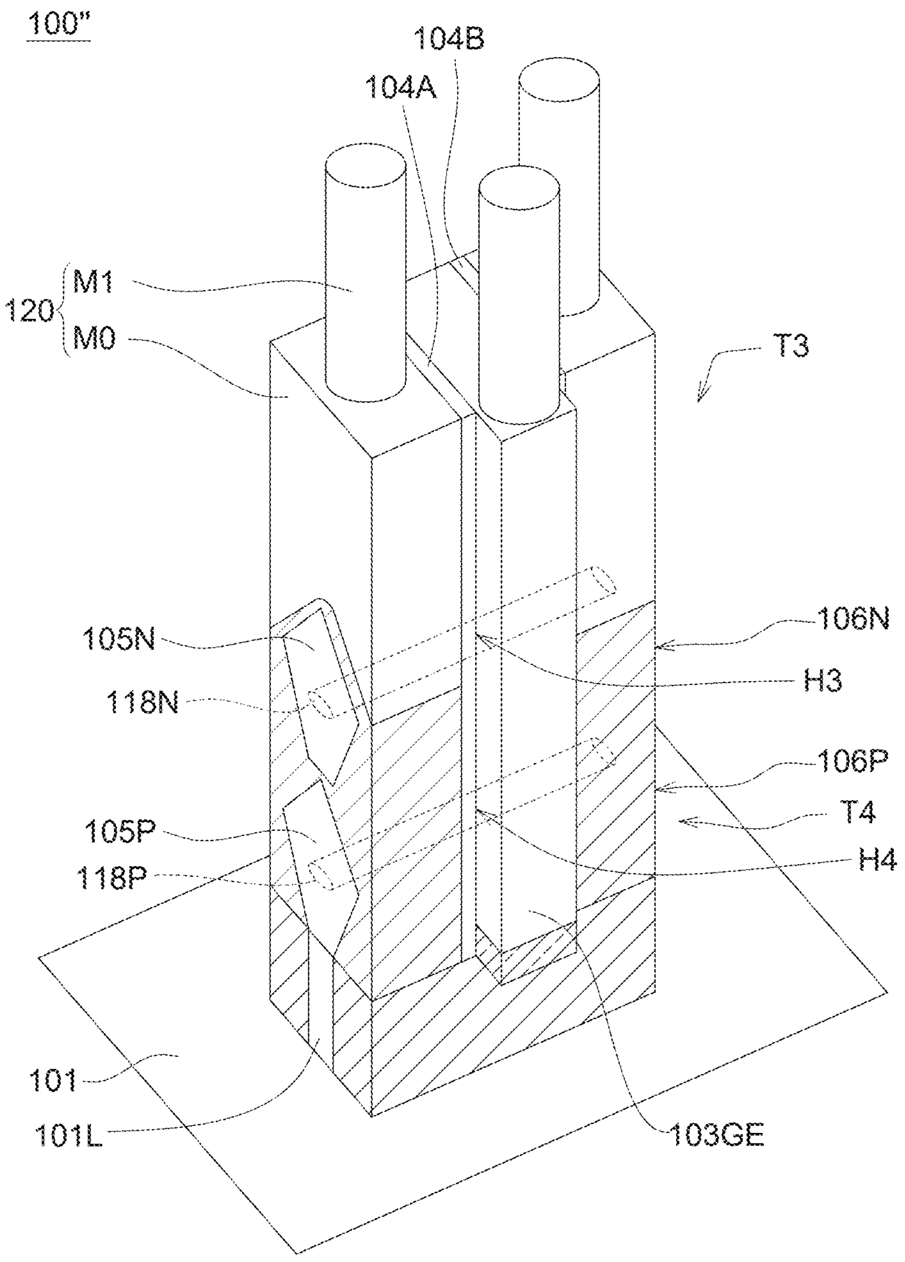
FIG. 2J is a partial perspective view illustrating a semiconductor circuit structure including a CFET structure according to yet another embodiment of the present disclosure.

FIG. 2J is a partial perspective view illustrating a semiconductor circuit structure 100" including a CFET structure according to yet another embodiment of the present disclosure. The structure of the semiconductor circuit structure 100" as depicted in FIG. 2J is similar to that of the semiconductor circuit structure 100 as depicted in FIG. 2H except that the CFET structure of the semiconductor circuit structure 100" includes an N-type GAA transistor T3 (with a ore more N-type channel 118N) and a P-type GAA transistor T4 (with a or more P-type channel 118P).

In the present embodiment, the first spacer 104A and the second spacer 104B are also very close to the hot spots H3 and H4 respectively in the interface between the channel region 118N and the source structure 105N (or the interface between the channel region 118N and the drain structure 106N) and in the interface between the channel region 118P and the source structure 105P (or the interface between the channel region 118P and the drain structure 106P), thus the first spacer 104A and the second spacer 104B can serves as an effective knob for cooling the CFET transistor.

Figure 3A:
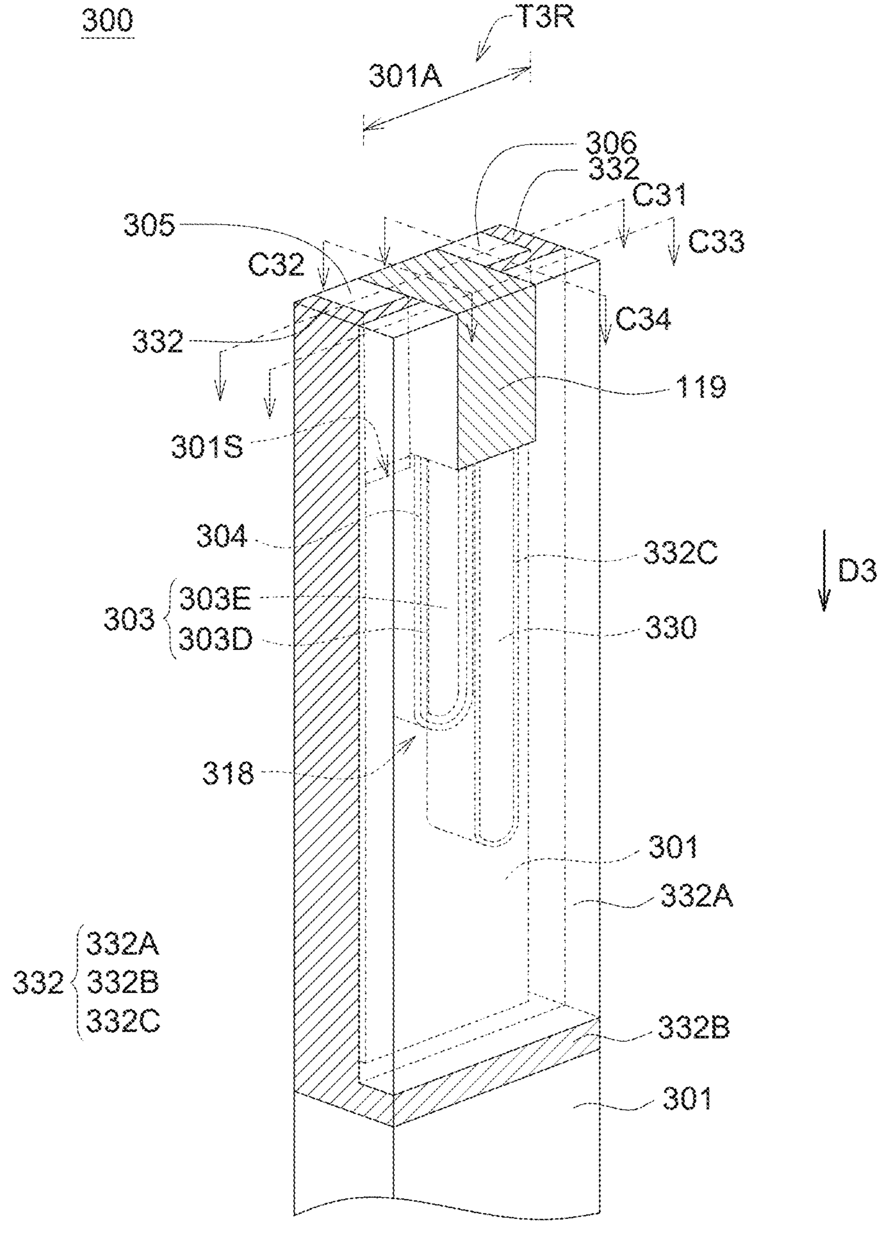
FIG. 3A is a perspective view illustrating a partial structure of semiconductor circuit structure according to another embodiment of the present disclosure.
Figure 3B:
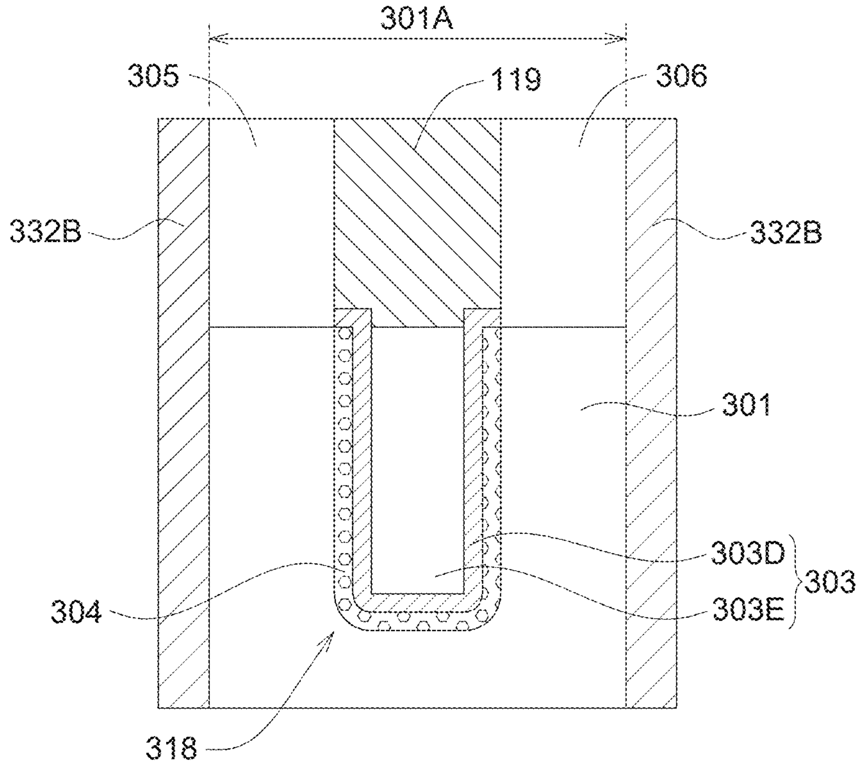
FIG. 3B~FIG. 3E are cross-sectional views taken along the cutting-line C31, C32, C33, and C34 as depicted in FIG. 3A, respectively.
Figure 3C:
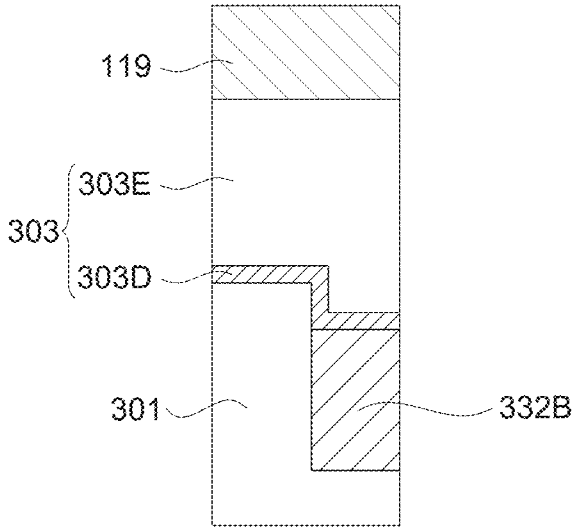
Figure 3D:
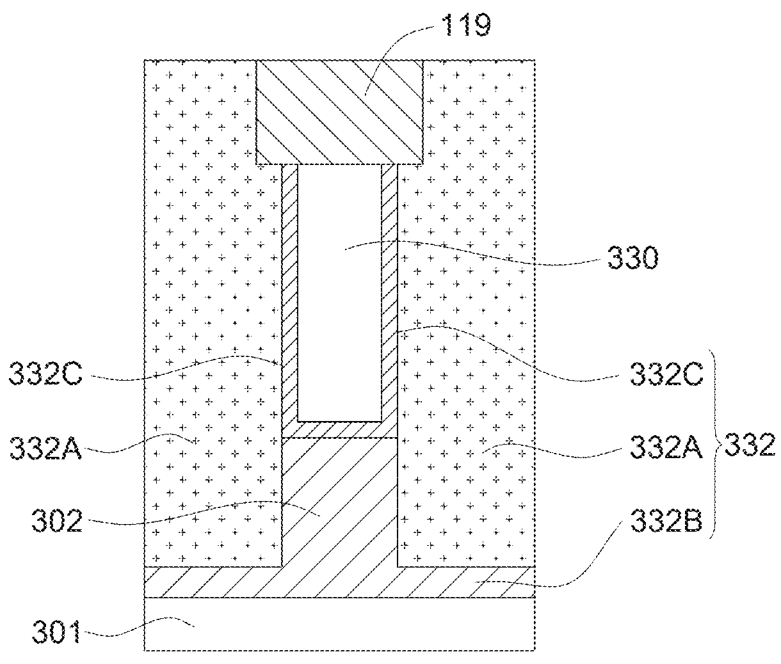
Figure 3E:
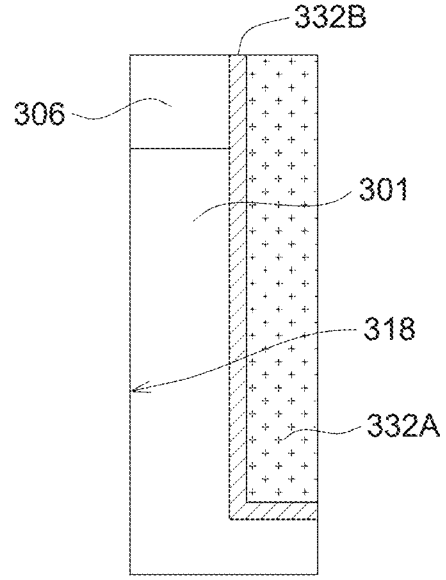

In another embodiment of the present invention, all or portion of the STI structure 102 in the STI region may be replaced by an isolation region 332 which includes a heat removing layer 332A, and the material of the heat removing layer 332A is different from silicon dioxide ($SiO_2$). Thus, there is heat removing layer within the STI region. For example, FIG. 3A is a perspective view illustrating a partial structure of semiconductor circuit structure 300 according to another embodiment of the present disclosure. FIG. 3B is a cross-sectional view taken along the cutting-line C31 as depicted in FIG. 3A; FIG. 3C is a cross-sectional view taken along the cutting-line C32 as depicted in FIG. 3A; FIG. 3D is a cross-sectional view taken along the cutting-line C33 as depicted in FIG. 3A; and FIG. 3E is a cross-sectional view taken along the cutting-line C34 as depicted in FIG. 3A.

In the present embodiment, the semiconductor circuit structure 300 includes a RG transistor T3R embedded in the active area 301A of the semiconductor substrate 301, and the bottom of the gate of the RG transistor T3R is beneath the original surface 301S of the semiconductor substrate 301. Wherein the active area 301A is surrounded by the STI region 332 extending along a first direction D3. Similar to the transistor T11 of the semiconductor circuit structure 100, the RG transistor T3R of the semiconductor circuit structure 300 includes a gate structure 303 (including a gate dielectric layer 303D and a gate electrode 303E) formed in the active area 301A of the semiconductor substrate 301, at least one heat removing spacer 304 neighboring to a sidewall of the gate structure 303 or sidewall of the source/drain regions 305/306, a channel region 318 under the gate structure 303, and the source/drain regions 305/306 connected to the channel region 318. Wherein the heat removing spacer 304 made of a material with a thermal conductivity higher than the thermal conductivity of $Si_3N_4$.

Furthermore, the STI region 332 includes a heat removing layer 332A mad of a material having a thermal conductivity higher than a thermal conductivity of silicon oxide and electrically isolated both from the semiconductor substrate 301 and a word line 330 connected to the gate structure 303. In some embodiments of the present disclosure, the STI region 332 include a heat removing layer 332A made by a material different from silicon dioxide ($SiO_2$), a dielectric lying layer 332B used to electrically isolated the heat removing layer 332A from the semiconductor substrate 301, and a dielectric isolation layer 332C used to electrically isolated the heat removing layer 332A from the word line 330 (or covering the top of the heat removing layer 332A).

In the present embodiment, the heat removing layer 332A is made of poly-silicon (or large-grain silicon) used to take the place of a portion of the STI region 332. In other words, the heat removing layer 332A is positioned in a front end of line (FEOL) region of the semiconductor circuit structure 300, and extends along the direction D3 under the original surface 301S of the semiconductor substrate 301. The dielectric lying layer 332B could be made of $SiO_2$; and the dielectric isolation layer 332C could be made of $SiO_2$. In order to electrically isolate the heat removing layer 332A from the semiconductor substrate 301, the dielectric lying layer 332B is neighboring to the sidewalls and the bottom of the heat removing layer 332A. The top of the heat removing layer 332A could be close to the top of the source/drain regions 305/306.

By using the heat removing layer 332A to take the place of the large portions of the conventional $SiO_2$ within the STI region 332 can further cool the transistor T3R and improve the heat dissipation of the semiconductor circuit structure 300. In some embodiments of the present disclosure, merely applying the heat removing layer 332A made of undoped polysilicon (or large-grain silicon) to take portions of the $SiO_2$ (without applying the heat removing spacer 304) can cool the transistor T3R down by dropping 24° C.~59° C., in comparison with the conventional transistor without applying the heat removing layer 332A and the heat removing spacer 304. For example, merely applying the heat the heat removing layer 332A made of polysilicon to take portions of the $SiO_2$ STI region 332 can cool the transistor T3R from 122.2° C. to 93.6° C. In addition, while the heat removing spacer 304 and the heat removing layer 332A are applied together, the temperature of the transistor T3R can be further reduced about 29° C.

Figure 4A:
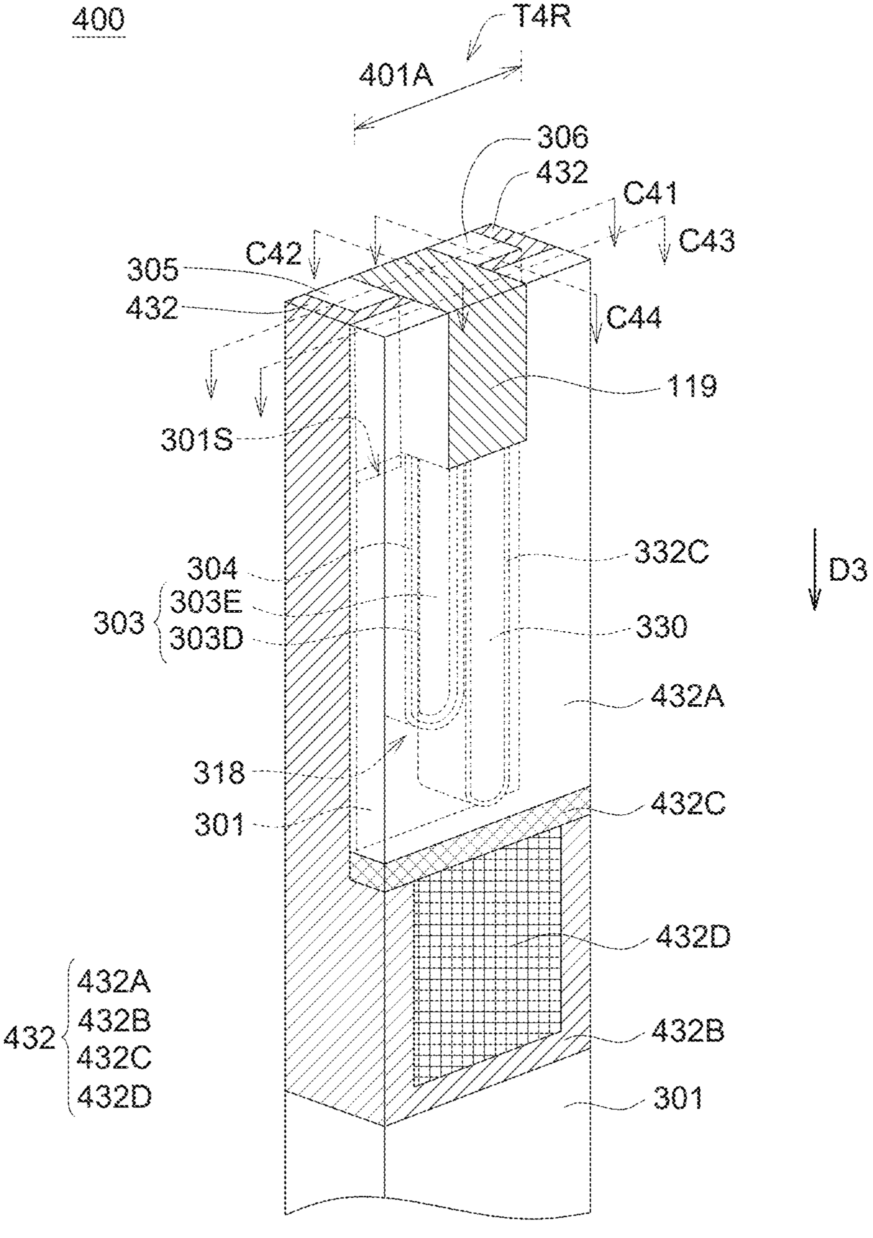
FIG. 4A is a perspective view illustrating a partial structure of semiconductor circuit structure according to another embodiment of the present disclosure.
Figure 4B:
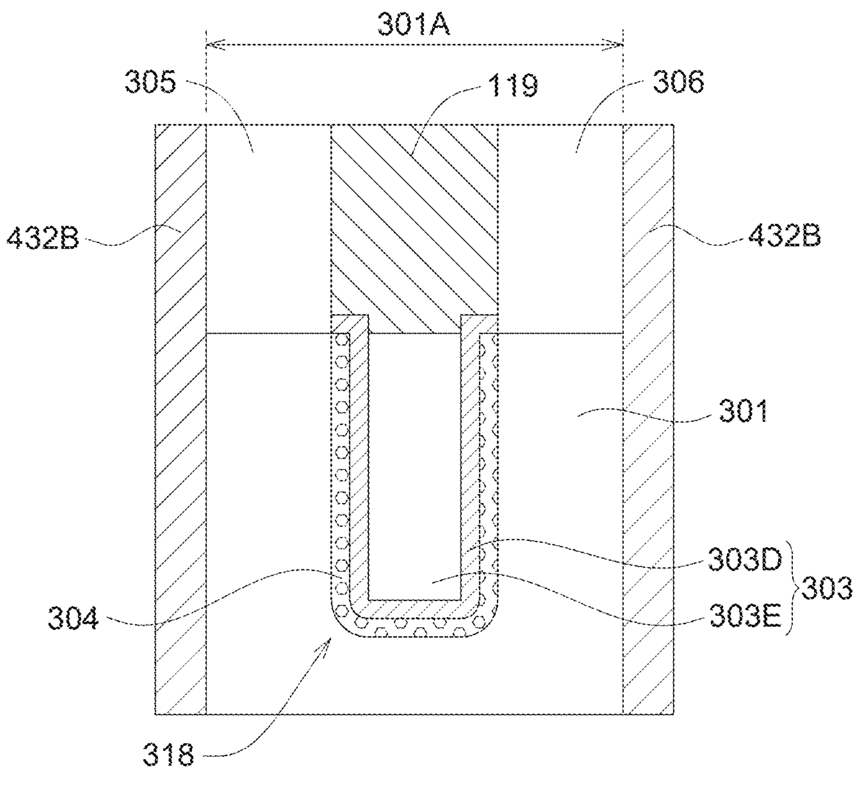
FIG. 4B~FIG. 4E are cross-sectional views taken along the cutting-line C41, C42, C43, and C44 as depicted in FIG. 4A, respectively.
Figure 4C:
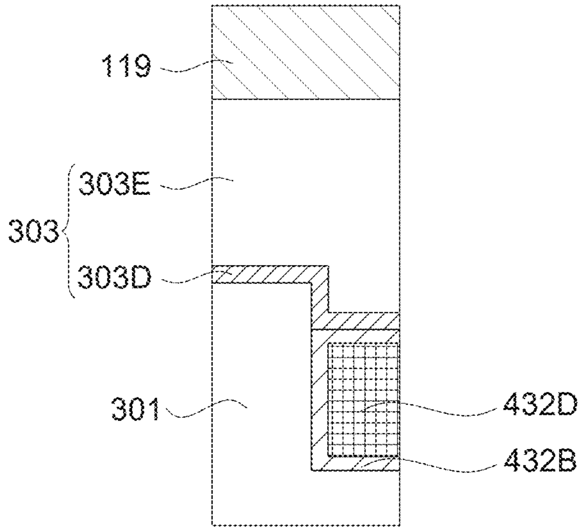
Figure 4D:
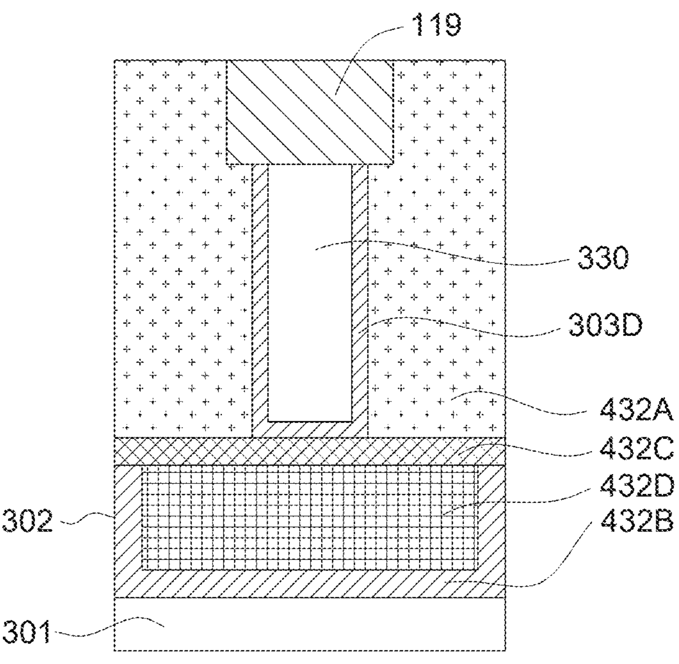
Figure 4E:
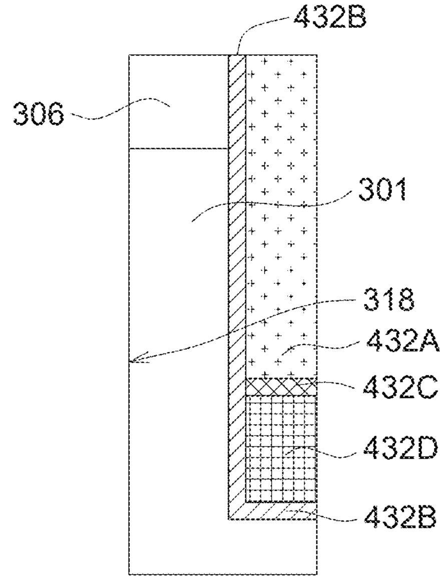

FIG. 4A is a perspective view illustrating a partial structure of semiconductor circuit structure 400 according to another embodiment of the present disclosure. FIG. 4B is a cross-sectional view taken along the cutting-line C31 as depicted in FIG. 4A; FIG. 4C is a cross-sectional view taken along the cutting-line C42 as depicted in FIG. 4A; FIG. 4D is a cross-sectional view taken along the cutting-line C43 as depicted in FIG. 4A; and FIG. 4E is a cross-sectional view taken along the cutting-line C44 as depicted in FIG. 4A. The structure of the semiconductor circuit structure 400 is similar to that of the semiconductor circuit structure 300 as depicted in FIGS. 3A-3E, except that the isolation region 432 of the transistor T4R further includes a high thermal dissipation region 432D under the heat removing layer 432A.

In some embodiments of the present disclosure, the high thermal dissipation region 432D is formed by using a material with a thermal conductivity higher than the thermal conductivity of silicon to take the place of another portion of the STI region 432 (a portion of the dielectric lying layer 432B). For example, in the present embodiment, the high thermal dissipation region 432D is made of metal (such as tungsten (W), TiN or the combination thereof) and could be electrically isolated from the heat removing layer 432A by another dielectric isolation layer 432C. In some embodiments of the present disclosure, the material for forming the dielectric isolation layer 432C and the high thermal dissipation region 432D may be the same.

By using the combination of the heat removing layer 432A and the high thermal dissipation region 432D can further cool down the transistor T4R (such as further reducing about 3.8° C., as compared with merely the heat removing layer 432A in the transistor T3R) and improve the heat dissipation of the semiconductor circuit structure 400.

Moreover, since the process and material for forming the heat removing spacer 304, the heat removing layer 432A and the high thermal dissipation region 432D can be provided from and integrated in the standard processing flow of the semiconductor circuit structure, thus the thermal dissipation capability of the semiconductor circuit structure can be effectively improve without adding expensive cost.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor circuit structure comprising:

a semiconductor substrate with an original semiconductor surface;

an active region within the semiconductor substrate; and a transistor formed within the active region, the transistor comprising:

a gate structure with a gate conductive layer;

a first spacer neighboring to a first sidewall of the gate structure; and a second spacer neighboring to a second sidewall of the gate structure; and a shallow trench isolation (STI) region comprising a heat removing layer surrounding the transistor; wherein a top surface of the heat removing layer is higher than that of the gate conductive layer, and a thermal conductivity of the heat removing layer is higher than that of $SiO_2$.

2. The semiconductor circuit structure according to claim 1, wherein the transistor is a fin field-effect transistor (FinFET), a gate-all-around (GAA) transistor, a recessed gate (RG) transistor or a complementary field-effect transistor (CFET).

3. The semiconductor circuit structure according to claim 1, wherein the heat removing layer is within the STI region and isolated from the semiconductor substrate.

4. The semiconductor circuit structure according to claim 3, wherein:

a dielectric isolation layer is over the heat removing layer.

5. The semiconductor circuit structure according to claim 1, wherein the heat removing layer is located close to the source region or the drain region.

6. The semiconductor circuit structure according to claim 1, wherein the heat removing layer is made of a material selected from a group consisting of SiC, h-BN, AlN and the arbitrary combinations thereof.

7. A semiconductor circuit structure comprising:

a semiconductor substrate with an original semiconductor surface;

an active region within the semiconductor substrate; and a transistor formed within the active region, the transistor comprising:

a gate structure with a gate conductive layer;

a first spacer neighboring to a first sidewall of the gate structure; and a second spacer neighboring to a second sidewall of the gate structure;

a channel region covered by the gate structure;

a source structure coupled to a first terminal of the channel region; and a drain structure coupled to a second terminal of the channel region; wherein the first spacer is between the gate structure and the source structure, and the second spacer is between the gate structure and the drain structure; and a heat removing layer surrounding the transistor; wherein a top surface of the heat removing layer is higher than that of the gate conductive layer, and a thermal conductivity of the heat removing layer is higher than that of $SiO_2$.

8. The semiconductor circuit structure according to claim 7, wherein the source structure comprises a first lightly doped drain (LDD) region and a first heavily doped region, and the first spacer covers the first LDD region or the first heavily doped region of the source structure.

9. The semiconductor circuit structure according to claim 8, wherein the drain structure comprises a second LDD region and a second heavily doped region, and the second spacer covers the second LDD region or the second heavily doped region of the drain structure.

10. A semiconductor circuit structure comprising:

a semiconductor substrate with an original semiconductor surface;

an active region within the semiconductor substrate; and a transistor formed within the active region, the transistor comprising:

a gate structure with a gate conductive layer;

a first spacer neighboring to a first sidewall of the gate structure; and a second spacer neighboring to a second sidewall of the gate structure; and a heat removing layer surrounding the transistor; wherein a top surface of the heat removing layer is higher than that of the gate conductive layer, and a thermal conductivity of the heat removing layer is higher than that of $SiO_2$;

wherein the heat removing layer is undoped polysilicon or large-grain silicon.

11. A semiconductor circuit structure comprising:

a semiconductor substrate with an original semiconductor surface;

an active region within the semiconductor substrate; and a transistor formed within the active region, the transistor comprising:

a gate structure with a gate conductive layer;

a first spacer neighboring to a first sidewall of the gate structure; and a second spacer neighboring to a second sidewall of the gate structure;

a heat removing layer surrounding the transistor; wherein a top surface of the heat removing layer is higher than that of the gate conductive layer, and a thermal conductivity of the heat removing layer is higher than that of $SiO_2$; and a dielectric lying layer covering sidewalls of the heat removing layer to electrically isolated the heat removing layer from the semiconductor substrate.

* * * * *